US011374166B2

(12) United States Patent
Sasaki

(10) Patent No.: US 11,374,166 B2
(45) Date of Patent: Jun. 28, 2022

(54) SPIN CURRENT MAGNETIZATION ROTATIONAL ELEMENT, MAGNETORESISTANCE EFFECT ELEMENT, AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 176 days.

(21) Appl. No.: 15/778,159

(22) PCT Filed: Nov. 25, 2016

(86) PCT No.: PCT/JP2016/084974
§ 371 (c)(1),
(2) Date: May 22, 2018

(87) PCT Pub. No.: WO2017/090728
PCT Pub. Date: Jun. 1, 2017

(65) Prior Publication Data
US 2018/0351083 A1    Dec. 6, 2018

(30) Foreign Application Priority Data

Nov. 27, 2015 (JP) ................................ 2015-232334
Mar. 16, 2016 (JP) ................................ 2016-053072
(Continued)

(51) Int. Cl.
*G11C 11/16* (2006.01)
*H01L 43/10* (2006.01)
(Continued)

(52) U.S. Cl.
CPC ............ *H01L 43/06* (2013.01); *G01R 33/098* (2013.01); *G11B 5/39* (2013.01); *G11C 11/161* (2013.01);
(Continued)

(58) Field of Classification Search
CPC ....... G11C 11/161; G11C 11/16; H01L 43/06; H01L 43/08; H01L 43/10; H01L 43/14
See application file for complete search history.

(56) References Cited

U.S. PATENT DOCUMENTS

| 4,785,241 A | 11/1988 | Abiko et al. |
| 6,754,100 B1 | 6/2004 | Hayakawa |

(Continued)

FOREIGN PATENT DOCUMENTS

| JP | 2009-094104 A | 4/2009 |
| JP | 2009194070 A | 8/2009 |

(Continued)

OTHER PUBLICATIONS

Feb. 26, 2019 Office Action issued in U.S. Appl. No. 15/778,577.
(Continued)

*Primary Examiner* — Kenneth Parker
*Assistant Examiner* — Long H Le
(74) *Attorney, Agent, or Firm* — Oliff PLC

(57) ABSTRACT

A spin current magnetization rotational element according to the present disclosure includes a first ferromagnetic metal layer configured for a direction of magnetization to be changed and a spin-orbit torque wiring extending in a direction intersecting a lamination direction of the first ferromagnetic metal layer and bonded to the first ferromagnetic metal layer. The spin-orbit torque wiring includes a narrow portion, and at least a part of the narrow portion constitutes a junction to the first ferromagnetic metal layer.

13 Claims, 13 Drawing Sheets

(30) Foreign Application Priority Data

| Mar. 18, 2016 | (JP) | ................................ 2016-056058 |
| Oct. 27, 2016 | (JP) | ................................ 2016-210531 |
| Oct. 27, 2016 | (JP) | ............................. JP2016-210533 |

(51) Int. Cl.

| H01L 43/06 | (2006.01) |
| H01L 43/08 | (2006.01) |
| H03B 15/00 | (2006.01) |
| G11B 5/39 | (2006.01) |
| H01L 29/82 | (2006.01) |
| H01L 27/105 | (2006.01) |
| H01F 10/32 | (2006.01) |
| G11C 11/18 | (2006.01) |
| H01L 43/04 | (2006.01) |
| H01L 27/22 | (2006.01) |
| H01L 43/02 | (2006.01) |
| H01L 43/14 | (2006.01) |
| G01R 33/09 | (2006.01) |

(52) U.S. Cl.
CPC ...... *G11C 11/1675* (2013.01); *G11C 11/1697* (2013.01); *G11C 11/18* (2013.01); *H01F 10/32* (2013.01); *H01F 10/329* (2013.01); *H01F 10/3254* (2013.01); *H01L 27/105* (2013.01); *H01L 27/222* (2013.01); *H01L 29/82* (2013.01); *H01L 43/02* (2013.01); *H01L 43/04* (2013.01); *H01L 43/08* (2013.01); *H01L 43/10* (2013.01); *H01L 43/14* (2013.01); *H03B 15/00* (2013.01); *H03B 15/006* (2013.01); *H01F 10/3286* (2013.01)

(56) References Cited

U.S. PATENT DOCUMENTS

| 8,350,347 | B2 | 1/2013 | Gaudin et al. | |
| 9,218,864 | B1* | 12/2015 | Yi | H01L 43/08 |
| 9,589,619 | B2 | 3/2017 | Lee et al. | |
| 9,864,950 | B2 | 1/2018 | Datta et al. | |
| 9,953,692 | B1 | 4/2018 | Mihajlovic et al. | |
| 9,979,401 | B2 | 5/2018 | Pan et al. | |
| 10,211,393 | B2 | 2/2019 | Mihajlovic et al. | |
| 10,211,394 | B1 | 2/2019 | Inokuchi et al. | |
| 10,229,723 | B1 | 3/2019 | Choi et al. | |
| 10,360,963 | B2 | 7/2019 | Park et al. | |
| 10,726,892 | B2 | 7/2020 | Le et al. | |
| 10,964,885 | B2 | 3/2021 | Sasaki | |
| 2002/0160234 | A1 | 10/2002 | Sakawaki et al. | |
| 2006/0114714 | A1 | 6/2006 | Kanegae | |
| 2008/0311431 | A1 | 12/2008 | Fuji et al. | |
| 2008/0316657 | A1 | 12/2008 | Zhang et al. | |
| 2009/0091863 | A1 | 4/2009 | Hosotani et al. | |
| 2009/0166773 | A1 | 7/2009 | Ohno et al. | |
| 2009/0201614 | A1 | 8/2009 | Kudo et al. | |
| 2010/0091555 | A1 | 4/2010 | Fukami | |
| 2010/0148167 | A1 | 6/2010 | Whig et al. | |
| 2010/0193888 | A1 | 8/2010 | Gu et al. | |
| 2010/0227050 | A1 | 9/2010 | Kurokawa | |
| 2011/0169112 | A1 | 7/2011 | Chen et al. | |
| 2011/0188298 | A1* | 8/2011 | Suzuki | G11C 19/0808 365/158 |
| 2012/0250189 | A1 | 10/2012 | Degawa et al. | |
| 2013/0114334 | A1 | 5/2013 | Yi et al. | |
| 2014/0010004 | A1 | 1/2014 | Suzuki | |
| 2014/0056060 | A1 | 2/2014 | Khvalkovskiy et al. | |
| 2014/0124882 | A1 | 5/2014 | Khalili Amiri et al. | |
| 2014/0211552 | A1 | 7/2014 | Pi et al. | |
| 2014/0252439 | A1* | 9/2014 | Guo | G11C 11/1675 257/295 |
| 2014/0269032 | A1 | 9/2014 | Ong et al. | |
| 2014/0312441 | A1* | 10/2014 | Guo | H01L 43/08 257/427 |
| 2015/0008547 | A1 | 1/2015 | Pi et al. | |
| 2015/0036415 | A1 | 2/2015 | Di Pendina et al. | |
| 2015/0041934 | A1 | 2/2015 | Khvalkovskiy et al. | |
| 2015/0097159 | A1 | 4/2015 | Apalkov et al. | |
| 2015/0200003 | A1 | 7/2015 | Buhrman et al. | |
| 2015/0213867 | A1* | 7/2015 | Wu | G11C 11/1675 365/158 |
| 2015/0213869 | A1 | 7/2015 | Wu et al. | |
| 2015/0236247 | A1 | 8/2015 | Behin-Aein et al. | |
| 2015/0348606 | A1 | 12/2015 | Buhrman et al. | |
| 2016/0042778 | A1 | 2/2016 | Manipatruni et al. | |
| 2016/0247550 | A1 | 8/2016 | Fukami et al. | |
| 2016/0276006 | A1 | 9/2016 | Ralph et al. | |
| 2016/0300999 | A1* | 10/2016 | Yi | H01L 43/10 |
| 2016/0359105 | A1 | 12/2016 | Sandhu et al. | |
| 2016/0380185 | A1 | 12/2016 | Kato et al. | |
| 2017/0117323 | A1* | 4/2017 | Braganca | H01L 43/10 |
| 2017/0125078 | A1 | 5/2017 | Mihajlovic et al. | |
| 2017/0178705 | A1 | 6/2017 | Buhrman et al. | |
| 2017/0222135 | A1 | 8/2017 | Fukami et al. | |
| 2017/0249990 | A1 | 8/2017 | Bauer et al. | |
| 2017/0316813 | A1 | 11/2017 | Lee et al. | |
| 2018/0158588 | A1* | 6/2018 | Manipatruni | H01F 10/3268 |
| 2018/0190899 | A1 | 7/2018 | Kim et al. | |
| 2018/0268886 | A1 | 9/2018 | Ishikawa et al. | |
| 2018/0277746 | A1 | 9/2018 | Abe et al. | |
| 2018/0375015 | A1 | 12/2018 | Sasaki | |
| 2019/0108865 | A1 | 4/2019 | Sasaki et al. | |
| 2019/0147929 | A1 | 5/2019 | Sasaki et al. | |
| 2019/0148629 | A1 | 5/2019 | Sasaki et al. | |
| 2019/0386662 | A1 | 12/2019 | Lin et al. | |
| 2020/0006633 | A1 | 1/2020 | Lille | |
| 2020/0043538 | A1 | 2/2020 | Mihajlovic et al. | |
| 2020/0075073 | A1 | 3/2020 | Sasaki | |
| 2020/0083286 | A1 | 3/2020 | Manipatruni et al. | |
| 2020/0083427 | A1 | 3/2020 | Manipatruni et al. | |
| 2020/0098410 | A1 | 3/2020 | Gosavi et al. | |
| 2020/0135804 | A1 | 4/2020 | Luo et al. | |
| 2020/0136017 | A1 | 4/2020 | Ashida et al. | |
| 2020/0168383 | A1 | 5/2020 | Oikawa et al. | |
| 2020/0235289 | A1 | 7/2020 | Alam et al. | |
| 2020/0243603 | A1 | 7/2020 | Lee et al. | |
| 2021/0091304 | A1 | 3/2021 | Endoh et al. | |
| 2021/0098040 | A1 | 4/2021 | Shiokawa et al. | |
| 2021/0167277 | A1 | 6/2021 | Chem | |
| 2021/0175412 | A1 | 6/2021 | Chem | |
| 2021/0226118 | A1 | 7/2021 | Peng et al. | |
| 2021/0249470 | A1 | 8/2021 | Shiokawa et al. | |

FOREIGN PATENT DOCUMENTS

| JP | 2014045196 A | 3/2014 |
| JP | 2014179618 A | 9/2014 |
| JP | 2017-112358 A | 6/2017 |
| JP | 2019-047119 A | 3/2019 |
| JP | 2019-091791 A | 6/2019 |
| WO | 2008/099626 A1 | 8/2008 |
| WO | 2013/025994 A2 | 2/2013 |
| WO | 2015/102739 A2 | 7/2015 |
| WO | 2015/137021 A1 | 9/2015 |
| WO | 2016/021468 A1 | 2/2016 |
| WO | 2016/159017 A1 | 10/2016 |
| WO | 2016/182354 A1 | 11/2016 |

OTHER PUBLICATIONS

Jun. 26, 2019 Notice of Allowance issued in U.S. Appl. No. 15/777,884.
Aug. 19, 2020 Office Action issued in U.S. Appl. No. 16/671,567.
Jun. 3, 2021 Office Action issued in U.S. Appl. No. 15/778,174.
I.M. Miron et al., "Perpendicular switching of a single ferromagnetic layer induced by in-plane current injection", Nature, 476, pp. 189-194, 2011.
T. Kimura et al., "Estimation of spin-diffusion length from the magnitude of spin-current absorption: Multiterminal ferromagnetic/

(56) References Cited

OTHER PUBLICATIONS nonferromagnetic hybrid structures", Physical Review B72(1), pp. 014461-1-014461-6, 2005.
S. Takahashi et al., "Spin injection and detection in magnetic nanostructures", Physical Review B67(5), p. 052409-1-052409-4, 2003.
J. Bass et al., "Spin-diffusion lengths in metals and alloys, and spin-flipping at metal/metal interfaces: an experimentalist's critical review", J. Physics Condensed Matter 19, pp. 1-50, 2007.
Y.K. Kato et al., "Observation of the Spin Hall Effect in Semiconductors", Science, 306, pp. 1910-1913, 2004.
L. Liu et al., "Spin torque switching with the giant spin Hall effect of tantalum", Science, vol. 336, pp. 1-18, and vol. 555, pp. 1-12, 2012.
L. Liu et al., "Current-Induced Switching of Perpendicularly Magnetized Magnetic Layers Using Spin Torque from the Spin Hall Effect", Physical Review Letters, 109, pp. 096602-1-096602-5, 2012.
KS. Lee et al., "Threshold current for switching of a perpendicular magnetic layer induced by spin Hall effect", Applied Physics Letters, 102, pp. 112410-1-112410-5, 2013.
KS. Lee et al., "Thermally activated switching of perpendicular magnet by spin-orbit spin torque", Applied Physics Letters, 104, pp. 072413-1-072413-5, 2014.
G. Yu et al., "Switching of perpendicular magnetization by spin-orbit torques in the absence of external magnetic fields", nature nanotechnology, 9, pp. 548-554, 2014.
S. Fukami et al., "Magnetization switching by spin-orbit torque in an antiferromagnet-ferromagnet bilayer system", nature materials, 15, pp. 535-542, 2016.
S. Fukami et al., "A spin-orbit torque switching scheme with collinear magnetic easy axis and current; configuration", nature nanotechnology, 11, pp. 1-6, 2016.
M. Gradhand et al., "Spin Hall angle versus spin diffusion length: Tailored by impurities", Physical Review B, 81, pp. 245109-1-245109-5, 2010.
Feb. 7, 2017 International Search Report issued in Application No. PCT/JP2016/084968.
Feb. 7, 2017 International Search Report issued in Patent Application No. PCT/JP2016/085001.
Feb. 7, 2017 International Search Report issued in Patent Application No. PCT/JP2016/084976.
Feb. 14, 2017 International Search Report issued in Patent Application No. PCT/JP2016/084979.
Feb. 14, 2017 International Search Report issued in Patent Application No. PCT/JP2016/084974.
Feb. 7, 2017 International Search Report issued in Patent Application No. PCT/JP2016/084995.
U.S. Appl. No. 15/777,884, filed May 21, 2018 in the name of Sasaki et al.
U.S. Appl. No. 15/777,894, filed May 21, 2018 in the name of Sasaki.
U.S. Appl. No. 15/778,115, filed May 22, 2018 in the name of Shiokawa et al.
U.S. Appl. No. 15/778,174, filed May 22, 2018 in the name of Sasaki.
U.S. Appl. No. 15/778,577, filed May 23, 2018 in the name of Shiokawa et al.
Apr. 10, 2019 Office Action issued in U.S. Appl. No. 15/777,894.
Apr. 26, 2019 Office Action issued in U.S. Appl. No. 15/778,115.
Dec. 23, 2019 Office Action issued in U.S. Appl. No. 15/778,174.
Niimi et al; "Giant Spin Hall Effect Induced by Skew Scattering from Bismuth Impurities inside Thin Film CuBi Alloys;" Physical Review Letters; vol. 109; pp. 156602-1-156602-5; Oct. 12, 2012.
Laczkowski et al; "Experimental evidences of a large extrinsic spin Hall effect in AuW alloy;" Applied Physics Letters; vol. 104; pp. 1-5; 2014.
Zhang et al; "Spin Hall Effects in Metallic Antiferromagnets;" Physical Review Letters; vol. 113; p. 196602-1-196602-6; Nov. 7, 2014.
Mar. 22, 2019 Office Action issued in U.S. Appl. No. 15/777,884.
Seo et al.; "Area-Efficient SOT-MRAM with a Schottky Diode;" IEEE Electron Device Letters; vol. 37; No. 8 pp. 982-985; Aug. 2016.
Aug. 18, 2021 Office Action issued in U.S. Appl. No. 17/184,206.
Jan. 18, 2022 Office Action issued in U.S. Appl. No. 15/778,174.

\* cited by examiner (a)

(b)

(a)

(b)

SPIN CURRENT MAGNETIZATION ROTATIONAL ELEMENT, MAGNETORESISTANCE EFFECT ELEMENT, AND MAGNETIC MEMORY

TECHNICAL FIELD

The present disclosure relates to a spin current magnetization rotational element, a magnetoresistance effect element, and a magnetic memory.

Priority is claimed on Japanese Patent Application No. 2015-232334, filed on Nov. 27, 2015, Japanese Patent Application No. 2016-53072, filed on Mar. 16, 2016, Japanese Patent Application No. 2016-56058, filed on Mar. 18, 2016, Japanese Patent Application No. 2016-210531, filed on Oct. 27, 2016, and Japanese Patent Application No. 2016-210533, filed on Oct. 27, 2016, the contents of which are incorporated herein by reference.

BACKGROUND ART

As magnetoresistance effect elements, a giant magnetoresistance (GMR) element formed by a multi-layered film with a ferromagnetic metal layer and a nonmagnetic layer and a tunnel magnetoresistance (TMR) element using an insulating layer (a tunnel barrier layer or a barrier layer) as a nonmagnetic layer are known. Generally, while a TMR element has a higher element resistance than a GMR element, the magnetic resistance (MR) ratio of a TMR element is higher than the MR ratio of a GMR element. For this reason, the TMR element has attracted attention as an element for a magnetic sensor, a high-frequency component, a magnetic head, and a nonvolatile RAM (MRAM).

As writing systems of an MRAM, a system performing writing (magnetization reversal) using a magnetic field generated by a current and a system performing writing (magnetization reversal) using a spin transfer torque (STT) generated by causing a current to flow in a lamination direction of a magnetoresistance element are known.

In the system using a magnetic field, in a case in which the element size is decreased, there is a problem in that writing may not be able to be performed with a current that can flow through a thin wiring.

In contrast to this, in a system using a spin transfer torque (STT), one ferromagnetic metal layer (a fixed layer or a reference layer) performs spin polarization of a current, the spin of the current is transferred to the magnetization of the other ferromagnetic metal layer (a free layer or a recording layer), and writing (magnetization reversal) is performed using a torque (STT) generated at that time. This system has an advantage that a current required for writing decreases when the element size is decreased.

CITATION LIST

Non-Patent Literature

[Non-Patent Literature 1] I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Technical Problem

While the magnetization reversal of a TMR element using an STT is efficient from the viewpoint of energy efficiency, the inversion current density for the magnetization reversal is high. From the viewpoint of a long life of a TMR element, it is preferable that this inversion current density be low. This point is similar for a GMR element.

In addition, in order to cause magnetization reversal at that time of writing information in a TMR element, it is necessary to cause a current that is sufficiently larger than that at the time of reading information to flow. From a viewpoint of the durability of the TMR element, it is preferable that a current applied at the time of writing information in the TMR is low.

Accordingly, in either one magnetoresistance effect element from the TMR element and a GMR element, it is preferable to decrease the current density of a current flowing through the magnetoresistance effect element.

In recent years, it has been proposed that magnetization reversal using a pure spin current generated in accordance with a spin orbit interaction could also be applied (for example, Non Patent Literature 1). A pure spin current that has undergone spin-orbit-interaction induces a spin orbit torque (SOT) and can cause magnetization reversal in accordance with the magnitude of the SOT. The pure spin current is generated by causing the same number of electrons having an upward spin and electrons having downward spin to flow in opposite directions, the flows of the electric charge canceling each other out, and the amount of current being generated in accordance with the pure spin current being zero. When magnetization can be reversed only using this pure spin current, a current flowing through the magnetoresistance effect element is zero, and thus, a longer life of the magnetoresistance effect element can be achieved. Alternatively, in a case in which the STT is also used for magnetization reversal, and an SOT according to a pure spin current can be used, a current used for the STT can be decreased in correspondence with the use of the SOT according to the pure spin current, and it is assumed that a longer life of the magnetoresistance effect element can be achieved. Also in a case in which both the STT and the SOT are used, it is assumed that a longer life of the magnetoresistance effect element can be achieved in accordance with a higher proportion for the use of the SOT.

The present invention was made in view of the problems described above, and an object thereof is to provide a spin current magnetization rotational element using magnetization reversal according to a pure spin current and a magnetoresistance effect element using a spin current magnetization rotational element.

Solution to Problem

In order to solve the problems described above, the present disclosure directs the following aspects.

(1) According to one aspect of the present disclosure, there is provided a spin current magnetization rotational element includes a first ferromagnetic metal layer configured for a direction of magnetization to be changed and a spin-orbit torque wiring extending in a direction intersecting a lamination direction of the first ferromagnetic metal layer and bonded to the first ferromagnetic metal layer, wherein the spin-orbit torque wiring includes a narrow portion, and at least a part of the narrow portion constitutes a junction to the first ferromagnetic metal layer.

(2) In the spin current magnetization rotational element described in (1) described above, the spin-orbit torque wiring may include a spin current generating part made of a material generating a spin current and a low resistance part made of a material having lower electrical resistance than that of the spin current generating part, and the narrow portion may be at least a part of the spin current generating part.

(3) In the spin current magnetization rotational element described in (1) described above, the spin-orbit torque wiring may include a spin current generating part made of a material generating a spin current and a low resistance part made of a material having lower electrical resistance than that of the spin current generating part, and the spin current generating part may be at least a part of the narrow portion.

(4) In the spin current magnetization rotational element described in any one of (1) to (3) described above, in the spin-orbit torque wiring, the narrow portion may have a thickness at least smaller than a thickness of a portion other than the narrow portion.

(5) In the spin current magnetization rotational element described in any one of (1) to (4) described above, in the spin-orbit torque wiring, the narrow portion may have a width at least smaller than a width of portions other than the narrow portion in the plan view from the lamination direction.

(6) In the spin current magnetization rotational element described in any one of (1) to (5) described above, the spin-orbit torque wiring may be disposed to cover the first ferromagnetic metal layer in the plan view from the lamination direction.

(7) In the spin current magnetization rotational element described in any one of (1) to (6) described above, the spin current generating part may be made of a material selected from a group of tungsten, rhenium, osmium, iridium and an alloy including at least one of the metals.

(8) In the spin current magnetization rotational element described in any one of (1) to (7) described above, an insulating layer that is bonded to a face on a side opposite to a face of the spin-orbit torque wiring bonded to the first ferromagnetic metal layer may be further included.

(9) According to one aspect of the present disclosure, there is provided a magnetoresistance effect element including the spin current magnetization rotational element described in any one of (1) to (8) described above, a second ferromagnetic metal layer in which a magnetization direction is fixed, and a nonmagnetic layer interposed between the first ferromagnetic metal layer and the second ferromagnetic metal layer.

(10) According to one aspect of the present disclosure, there is provided a magnetic memory including a plurality of the magnetic resistance effect elements described in (9) described above.

A magnetization reversing method is a magnetization reversing method in the spin current magnetization rotational elements described in (1) to (8) described above and can configure a current density of a current flowing through the spin-orbit torque wiring to be less than $1 \times 10^7 A/cm^2$.

Advantageous Effects of Invention

According to a spin current magnetization rotational element of the present disclosure, magnetization reversal using a pure spin current can be performed.

DESCRIPTION OF EMBODIMENTS

Figure 1:
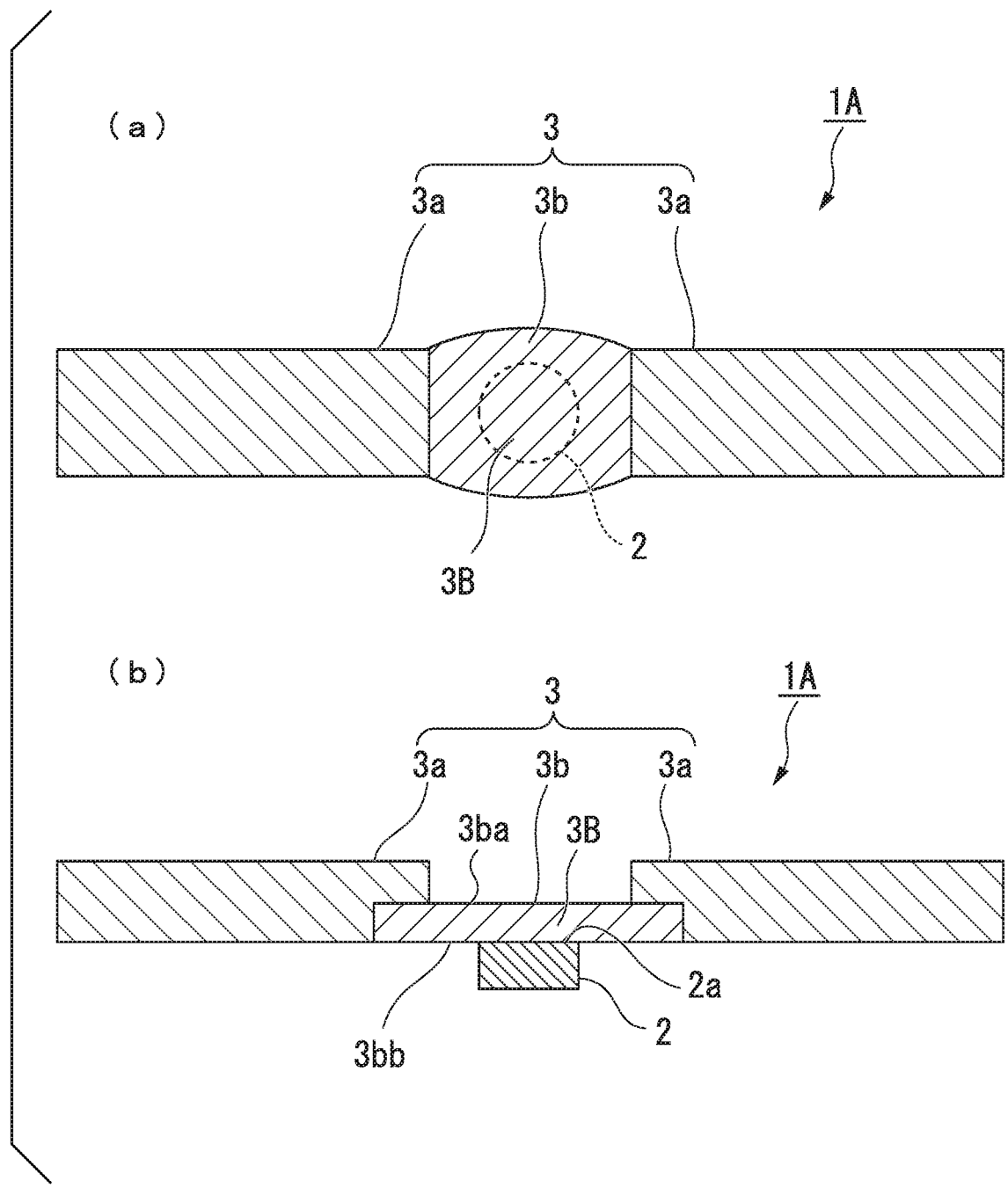
FIG. 1 is a schematic diagram illustrating a spin-orbit torque wiring of a spin current magnetization rotational element according to one embodiment of the present disclosure, (a) is a plan view, and (b) is a cross-sectional view.

Hereinafter, the present disclosure will be described in detail with reference to the drawings as is appropriate. In the drawings used in the following description, in order to allow easy understanding of aspects of the present disclosure, characteristic portions may be represented in enlarged scales for the convenience of the description, and the dimensions, the proportions, and the like of each constituent element may be different from actual values thereof. Materials, dimensions, and the like represented in the following description are examples, and thus, the present disclosure is not limited thereto, and may be appropriately changed in a range in which the effects of the present disclosure are accomplished. In an element according to the present disclosure, another layer may be included in a range in which the effects of the present disclosure are accomplished.

(Spin current magnetization rotational element)

FIG. 1 is a schematic diagram of one example of a spin current magnetization rotational element according to one embodiment of the present disclosure. FIG. 1(a) is a plan view, and FIG. 1(b) is a cross-sectional view taken along a center line in the longitudinal direction in FIG. 1(a) (a cross-sectional view passing through the center of a first ferromagnetic metal layer 2).

The spin current magnetization rotational element 1A includes: a first ferromagnetic metal layer 2 configured for the direction of magnetization to be changed; and a spin-orbit torque wiring 3 that extends in a direction intersecting the lamination direction of the first ferromagnetic metal layer and is bonded to the first ferromagnetic metal layer 2. The spin-orbit torque wiring 3 includes a narrow portion 3b, and at least a part of the narrow portion 3b constitutes a junction 3B for the first ferromagnetic metal layer 2.

The spin-orbit torque wiring 3 contains a material that generates a pure spin current in accordance with a spin Hall effect when a current flows through it, and the generated pure spin current diffuses and is injected into the first ferromagnetic metal layer 2 from the junction 3B for the first ferromagnetic metal layer 2.

The junction denoted by a reference sign 3B in FIG. 1 represents a part (also including a part in a thickness direction) of the spin-orbit torque wiring 3 that overlaps the first ferromagnetic metal layer 2 in the plan view. In other words, in FIG. 1(a) in which a portion acquired by projecting the first ferromagnetic metal layer 2 into the plan view is denoted using a dotted line, a portion surrounded by the dotted line shifted from one surface 3ba (see FIG. 1(b)) to the other surface 3bb (see FIG. 1(b) in the thickness direction is the junction 3B of the spin-orbit torque wiring 3.

Here, the spin-orbit torque wiring 3 and the first ferromagnetic metal layer 2 may be "direct" bonding or may be bonding "via another layer" such as a cap layer to be described later. A method of bonding (connection or coupling) between the spin-orbit torque wiring 3 and the first ferromagnetic metal layer is not particularly limited as long as a pure spin current generated in the spin-orbit torque wiring 3 is configured to flow into the first ferromagnetic metal layer 2.

The spin-orbit torque wiring 3 includes the narrow portion 3b. The narrow portion 3b is a portion in which a cross-sectional area cut out in a cross-section orthogonal to an extending direction (longitudinal direction) of the spin-orbit torque wiring 3 is smaller than a cross-sectional area of a portion other than the narrow portion 3b. A current flowing through the spin-orbit torque wiring 3 has a higher current density in this narrow portion 3b.

The spin-orbit torque wiring 3 may include a plurality of narrow portions 3b. The sizes of cross-sectional areas of the plurality of narrow portions may be different from each other. The cross-sectional area of each narrow portion is smaller than the cross-sectional area of portions other than the narrow portion having the narrow portion directly interposed therebetween.

In addition, in a narrow portion 3b included in the spin-orbit torque wiring 3 illustrated in FIG. 1, a junction 3B that is a part thereof is bonded to a face 2a of the first ferromagnetic metal layer 2. A current flowing through the spin-orbit torque wiring 3 has a higher current density in the narrow portion 3b, and the density of the generated pure spin current is increased. The high-density pure spin current promotes greater magnetization reversal of the first ferromagnetic metal layer 2 than in a case in which no narrow portion 3b is included. The narrow portion 3b of the spin-orbit torque wiring 3 illustrated in FIG. 1 has almost the same width as that of the other portions 3a and 3a other than the narrow portion 3b in the plan view from the lamination direction and has a thickness smaller than that of the other portions 3a and 3a other than the narrow portion 3b. According to this structure, the narrow portion 3b has a cross-sectional area cut along a cross-section orthogonal to the longitudinal direction of the spin-orbit torque wiring 3 which is smaller than that of the portions 3a and 3a other than the narrow portion 3b.

In addition, in FIG. 1, in the portions 3a and 3a other than the narrow portion 3b having the narrow portion 3b interposed therebetween, for the convenience of illustration, while portions having shapes of two kinds are illustrated near the narrow portion 3b, according to the present disclosure, the narrow portion 3b is a portion having a smaller cross-sectional area, and a portion in which the cross-sectional area is not smaller corresponds to the portions 3a and 3a other than the narrow portion 3b. This point is similar also in the other drawings.

Figure 2:
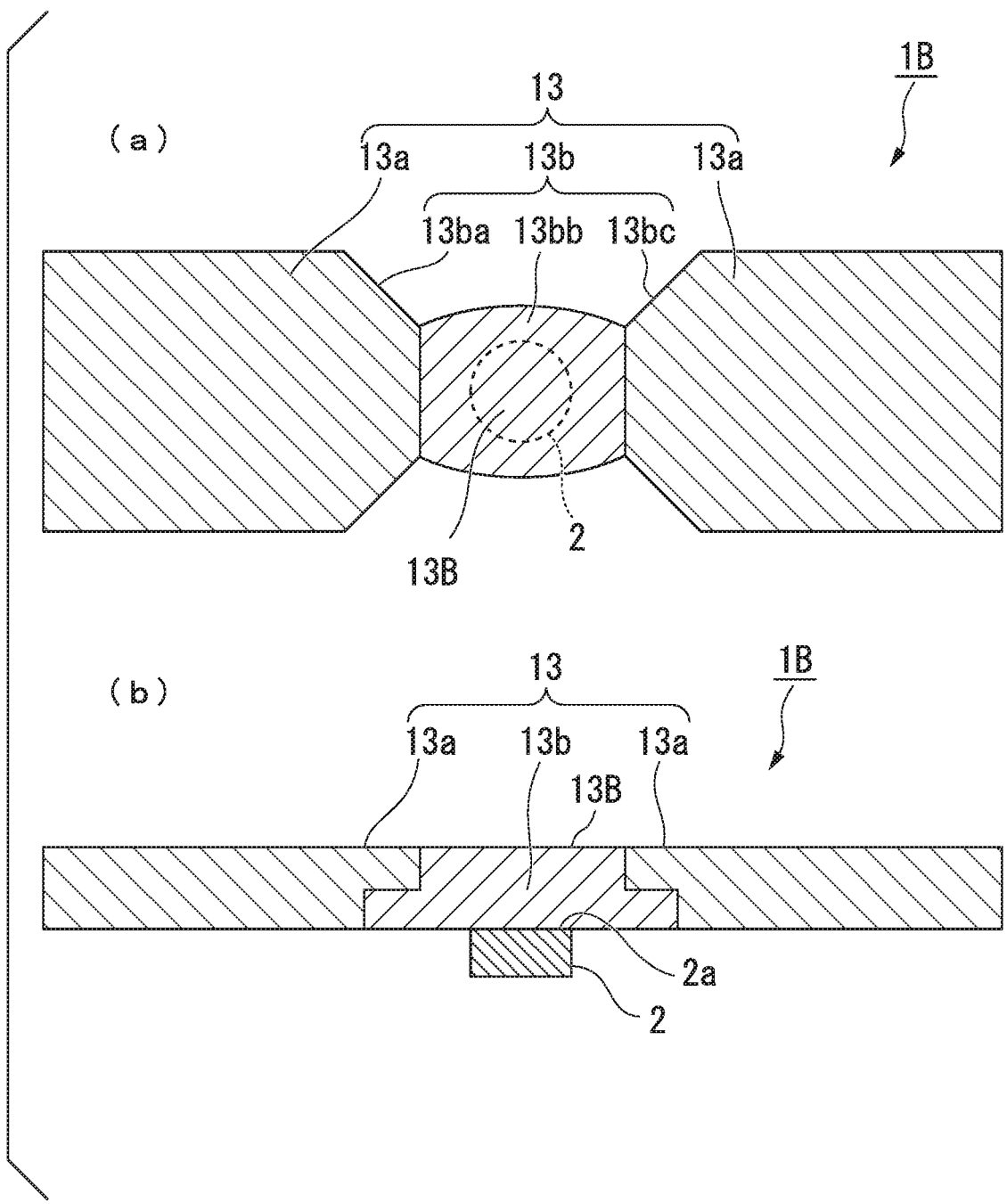
FIG. 2 is a schematic diagram illustrating a spin-orbit torque wiring of a spin current magnetization rotational element according to another embodiment of the present disclosure, (a) is a plan view, and (b) is a cross-sectional view.

FIG. 2 illustrates a schematic diagram of another example of a spin current magnetization rotational element according to one embodiment of the present disclosure. FIG. 2(a) is a plan view, and FIG. 2(b) is a cross-sectional view taken along a center line in the longitudinal direction (a cross-sectional view passing through the center of the first ferromagnetic metal layer 2).

In a narrow portion 13b included in a spin-orbit torque wiring 13 illustrated in FIG. 2, a junction 13B that is a part thereof is bonded to a face 2a of a first ferromagnetic metal layer 2. A current flowing through the spin-orbit torque wiring 13 has a higher current density in the narrow portion 13b, and the density of the generated pure spin current is increased. The high-density pure spin current promotes greater magnetization reversal of the first ferromagnetic metal layer 2 than in a case in which no narrow portion 13b is included.

In a spin current magnetization rotational element 1B illustrated in FIG. 2, the narrow portion 13b, as illustrated in FIGS. 2(a) and 2(b), has the same thickness as that of the other portions 13a and 13a other than the narrow portion 13b and is formed of tapered parts 13ba and 13bc in which the width decreases moving closer to a junction 13B for the first ferromagnetic metal layer 2 in the plan view from the lamination direction and a narrow with part 13bb that is interposed between the tapered parts 13ba and 13bc, has a width smaller than that of the other portions 13a and 13a other than the narrow portion 13b, and includes the junction 13B.

In the narrow portion 13b of the spin-orbit torque wiring 13 illustrated in FIG. 2, by using this structure, the narrow portion 13b has a cross-sectional area cut along a cross-section orthogonal to the longitudinal direction of the spin-orbit torque wiring 13 which is smaller than that of the other portions 13a and 13a other than the narrow portion 13b.

Figure 3:
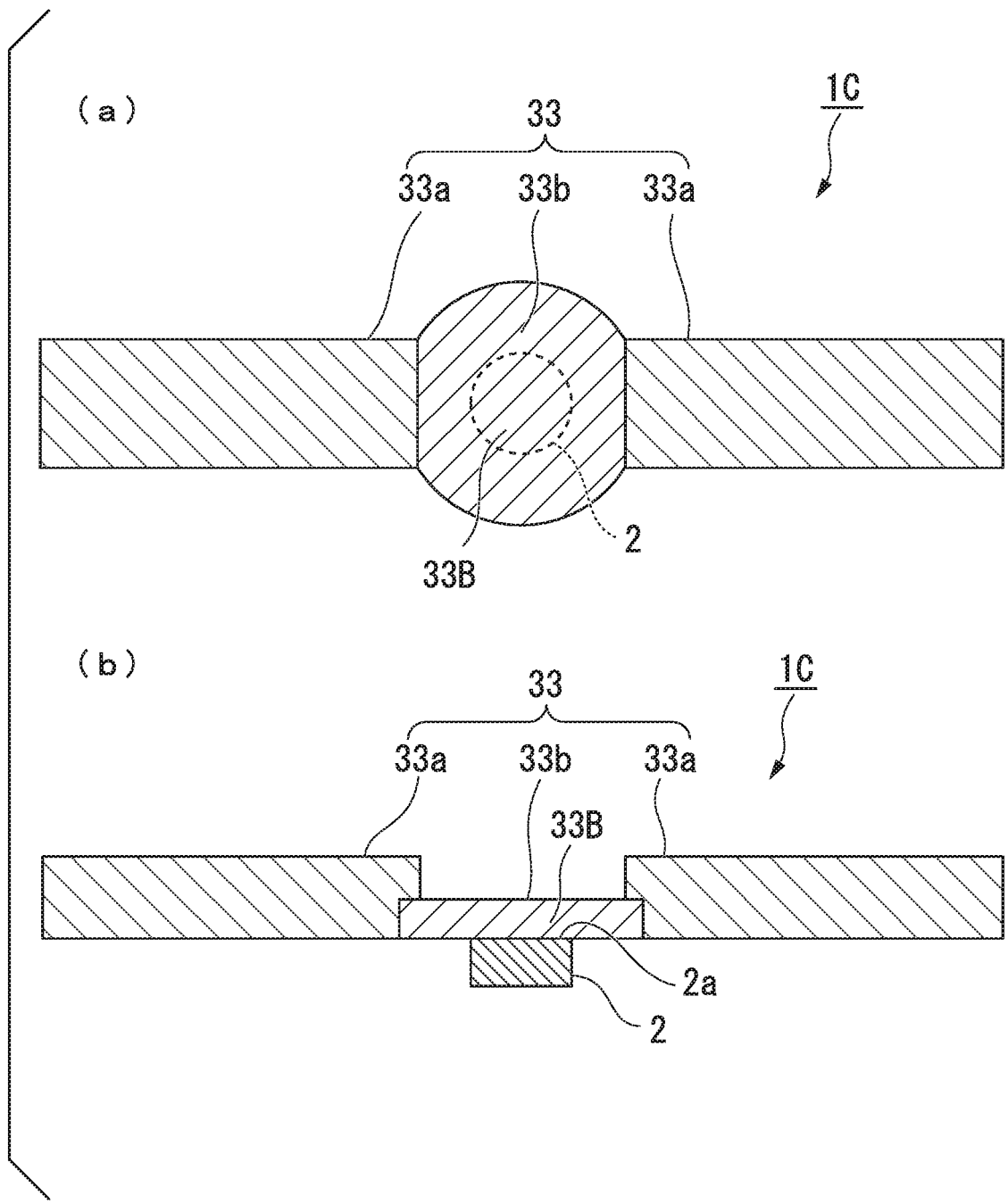
FIG. 3 is a schematic diagram illustrating a spin-orbit torque wiring of a spin current magnetization rotational element according to another embodiment of the present disclosure, (a) is a plan view, and (b) is a cross-sectional view.

FIG. 3 illustrates a schematic diagram of another example of a spin current magnetization rotational element according to one embodiment of the present disclosure. FIG. 3(a) is a plan view, and FIG. 3(b) is a cross-sectional view taken along a center line in the longitudinal direction (a cross-sectional view passing through the center of a first ferromagnetic metal layer 2).

In a narrow portion 33b included in a spin-orbit torque wiring 33 illustrated in FIG. 3, a junction 33B that is a part thereof is bonded to a face 2a of the first ferromagnetic metal layer 2. A current flowing through a spin-orbit torque wiring 33 has a higher current density in the narrow portion, and the density of the generated pure spin current is increased. The high-density pure spin current promotes greater magnetization reversal of the first ferromagnetic metal layer 2 than in a case in which no narrow portion 33b is included.

In the spin current magnetization rotational element 1C illustrated in FIG. 3, the narrow portion 33b, as illustrated in FIGS. 3(a) and 3(b), has a width larger than that of the other portions 33a and 33a other than the narrow portion 33b in the plan view from the lamination direction and has a thickness smaller than that of the other portions 33a and 33a other than the narrow portion 33b. According to this structure, the narrow portion 33b has a cross-sectional area cut along a cross-section orthogonal to the longitudinal direction of the spin-orbit torque wiring 33 which is smaller than that of the other portions 33a and 33a other than the narrow portion 33b.

In the examples illustrated in FIGS. 1 to 3, the spin-orbit torque wiring is disposed to cover (overlap) the first ferromagnetic metal layer in the plan view from the lamination direction.

Figure 4:
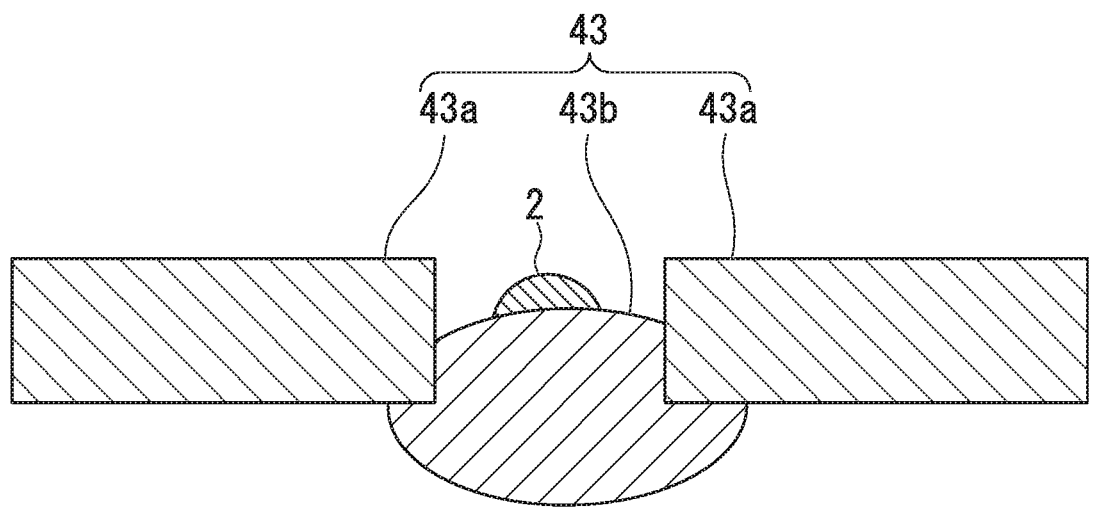
FIG. 4 is a schematic plan view illustrating a spin-orbit torque wiring of a spin current magnetization rotational element according to another embodiment of the present disclosure.

The reason for this is that, as in the example illustrated in FIG. 4, in a case in which there is a portion of the spin-orbit torque wiring 43 not overlapping with the first ferromagnetic metal layer 2, a situation occurs in which a spin current generated in the spin-orbit torque wiring 43 does not sufficiently flow through the first ferromagnetic metal layer 2. In the example illustrated in FIG. 4, the spin-orbit torque wiring 43 is formed of a narrow portion 43b and parts 43a and 43a having the narrow portion 43b interposed therebetween.

In the examples illustrated in FIGS. 1 to 3, the spin-orbit torque wirings 3, 13, and 33 are generated as below. After a first ferromagnetic metal layer 2 is formed as a film to form a planar shape, an insulating layer is formed such that a side wall of the first ferromagnetic metal layer 2 is not exposed. An upper portion of the first ferromagnetic metal layer 2 having a high degree of flatness is exposed using a CMP method, and a material of the narrow portion 3b, 13b, or 33b of the spin-orbit torque wiring 3, 13, or 33 is formed as a film. A planar structure as shown in (a) of FIGS. 1 to 3 is formed, and parts 3a, 13a, or 33a other than the narrow portion 3b, 13b, or 33b of the spin-orbit torque wiring 3, 13, or 33 are disposed to be electrically connectable to the narrow portion 3b, 13b, or 33b of the spin-orbit torque wiring 3, 13, or 33.

In addition, in the examples illustrated in FIGS. 1 to 3, although the spin-orbit torque wirings 3, 13, and 33 are formed on the first ferromagnetic metal layer 2, they may be formed in the reverse order.

The first ferromagnetic metal layer will be described later.

In addition, the spin-orbit torque wiring will be described in more detail later.

Hereinafter, although a magnetoresistance effect element using the spin current magnetization rotational element described above will be described, the use of the spin current magnetization rotational element described above is not limited to the magnetoresistance effect element. As another use, for example, the spin current magnetization rotational element described above may be used also in a spatial light modulator, in which the spin current magnetization rotational element described above is disposed in each pixel, incident light is spatially modulated using a magnetic optical effect, and, in order to avoid a hysteresis effect according to a coercivity of a magnet in a magnetic sensor, a magnetic field applied to an axis of easy magnetization axis may be substituted with SOT.

(Magnetoresistance effect element)

A magnetoresistance effect element according to one embodiment of the present disclosure includes: the spin current magnetization rotational element; a second ferromagnetic metal layer in which a magnetization direction is fixed; and a nonmagnetic layer interposed between a first ferromagnetic metal layer and the second ferromagnetic metal layer.

Figure 5:
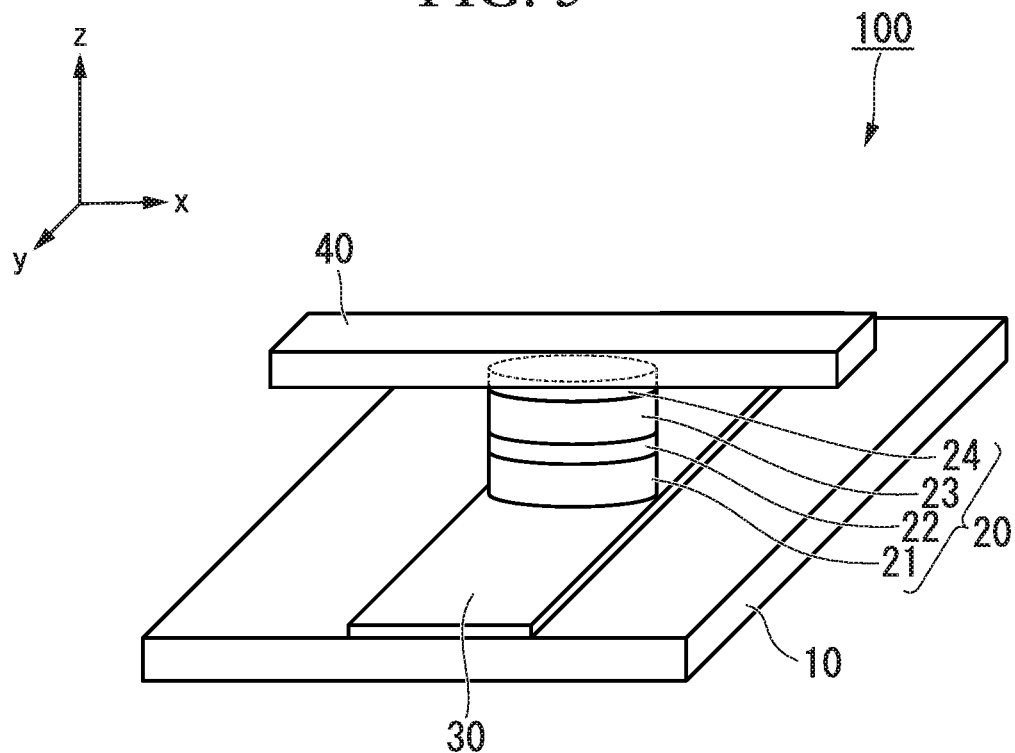
FIG. 5 is a perspective view schematically illustrating a magnetoresistance effect element according to one embodiment of the present disclosure.

FIG. 5 is a perspective view schematically illustrating a magnetoresistance effect element that is an application example of the spin current magnetization rotational element according to the present disclosure and is also a magnetoresistance effect element according to one embodiment of the present disclosure. In FIG. 5, the narrow portion of the spin-orbit torque wiring is not illustrated.

The magnetoresistance effect element 100 includes: a magnetoresistance effect element part 20; and a spin-orbit torque wiring 40 that extends in a direction intersecting the lamination direction of the magnetoresistance effect element part 20 and is bonded to the magnetoresistance effect element part 20.

Hereinafter, including FIG. 5, as an example of a configuration in which the spin-orbit torque wiring extends in the direction intersecting the lamination direction of the magnetoresistance effect element part, a case of a configuration in which the spin-orbit torque wiring extends in the orthogonal direction will be described.

In FIG. 5, a wiring 30 used for causing a current to flow in the lamination direction of the magnetoresistance effect element part 20 and a substrate 10 forming the wiring 30 are also illustrated.

Hereinafter, the lamination direction of the magnetoresistance effect element part 20 will be set as a direction z, a direction that is perpendicular to the direction z and is parallel to the spin-orbit torque wiring 40 will be set as a direction x, and a direction orthogonal to the direction x and the direction z will be set as a direction y.

<Magnetoresistance effect element part>

The magnetoresistance effect element part 20 includes: a second ferromagnetic metal layer 21 in which the magnetization direction is fixed; a first ferromagnetic metal layer 23 configured for the magnetization direction to be changed; and a nonmagnetic layer 22 interposed between the second ferromagnetic metal layer 21 and the first ferromagnetic metal layer 23.

The magnetization of the second ferromagnetic metal layer 21 is fixed to one direction, and the magnetization direction of the first ferromagnetic metal layer 23 relatively changes, whereby the function of the magnetoresistance effect element part 20 is achieved. In the case of an application to a coercivity differed type (pseudo spin valve type) MRAM, the coercivity of the second ferromagnetic metal layer is configured to be higher than the coercivity of the first ferromagnetic metal layer. In addition, in the case of an application to an MRAM of an exchange bias type (spin valve type), the magnetization direction of the second ferromagnetic metal layer 21 is fixed using exchange bonding with an antiferromagnetic metal layer.

In addition, the magnetoresistance effect element part 20 is a tunneling magnetoresistance (TMR) element in a case in which the nonmagnetic layer 22 is formed of an insulating layer and is a giant magnetoresistance (GMR) element in a case in which the nonmagnetic layer 22 is made of a metal.

As the magnetoresistance effect element part included in the present disclosure, the configuration of a known magnetoresistance effect element part may be used. For example, each layer may be formed of a plurality of layers or may include another layer such as an antiferromagnetic metal layer used for fixing the magnetization direction of the second ferromagnetic metal layer.

The second ferromagnetic metal layer 21 is called a magnetization fixed layer or a reference layer, and the first ferromagnetic metal layer 23 is called a magnetization free layer, a recording layer, or the like.

The second ferromagnetic metal layer 21 and the first ferromagnetic metal layer 23 may be either in-plane magnetization films in which a magnetization direction is an in-plane direction parallel to the layer or vertical magnetization films in which the magnetization direction is a direction perpendicular to the layer.

As the material of the second ferromagnetic metal layer 21, a known material may be used. For example, a metal selected from a group made of Cr, Mn, Co, Fe, and Ni and an alloy which contains one or more of such metals and represents a ferromagnetic property may be used. In addition, an alloy containing such metals and at least one or more elements of B, C, and N may be used as the material of the second ferromagnetic metal layer 21. More specifically, examples thereof include Co—Fe and Co—Fe—B.

In order to acquire a higher output, it is preferable to use a Heusler alloy such as Co2FeSi. The Heusler alloy contains an intermetallic compound having a chemical composition of $X_2YZ$. Here, X is a transitional metal element of a Co, Fe, Ni, or Cu group or a noble metal element in a periodic table, Y is a transitional metal of an Mn, V, Cr, or Ti group and may take an element group of X, and Z is a typical element of a group III to a group V. Examples of the Heusler alloy include Co2FeSi, Co2MnSi, $Co_2Mn_{1-a}Fe_aAl_bSi_{1-b}$, and the like.

In order to increase the coercivity of the second ferromagnetic metal layer 21 with respect to the first ferromagnetic metal layer 23, an antiferromagnetic material such as IrMn or PtMn may be used as a material brought into contact with the second ferromagnetic metal layer 21. In order to prevent an influence of a leaked magnetic field of the second ferromagnetic metal layer 21 on the first ferromagnetic metal layer 23, a structure of a synthetic ferromagnetic coupling may be used.

In a case in which the direction of the magnetization of the second ferromagnetic metal layer 21 is perpendicular to the stacking face, it is preferable to use a stacking film of Co and Pt. More specifically, as the second ferromagnetic metal layer 21, [Co(0.24 nm)/Pt(0.16 nm)]$_6$/Ru(0.9 nm)/[Pt(0.16 nm)/Co(0.16 nm)]$_4$/Ta(0.2 nm)/FeB(1.0 nm) may be used.

As the material of the first ferromagnetic metal layer 23, a ferromagnetic material, more particularly, a soft magnetic material may be used. For example, a metal selected from a group made of Cr, Mn, Co, Fe, and Ni, an alloy containing one or more of such metals, an alloy containing such metals and at least one or more of B, C, and N, or the like may be used as the material of the first ferromagnetic metal layer 23. More specifically, examples thereof include Co—Fe, Co—Fe—B, and Ni—Fe.

In a case in which the direction of the magnetization of the first ferromagnetic metal layer 23 is perpendicular to the stacking face, it is preferable to configure the thickness of the first ferromagnetic metal to be 2.5 nm or less. In an interface between the first ferromagnetic metal layer 23 and the nonmagnetic layer 22, vertical magnetic anisotropy may be added to the first ferromagnetic metal layer 23. In addition, by increasing the film thickness of the first ferromagnetic metal layer 23, the effect of the vertical magnetic anisotropy attenuates, and accordingly, it is preferable that the film thickness of the first ferromagnetic metal layer 23 be small.

For the nonmagnetic layer 22, a known material may be used.

For example, in a case in which the nonmagnetic layer 22 is formed of an insulator (in the case of a tunnel barrier layer), as the material thereof, $Al_2O_3$, $SiO_2$, MgO, $MgAl_2O_4$, or the like may be used. In addition, other than such materials, a material acquired by substituting some of Al, Si, or Mg with Zn, Be, or the like may be used. Among such materials, MgO and $MgAl_2O_4$ are materials that can realize coherent tunneling, and thus spin can be efficiently injected.

In addition, in a case in which the nonmagnetic layer 22 is made of a metal, Cu, Au, Ag, or the like may be used as the material thereof.

On a face of the first ferromagnetic metal layer 23 on a side opposite to the nonmagnetic layer 22, as illustrated in FIG. 5, a cap layer 24 is preferably formed. The cap layer 24 can suppress diffusion of elements from the first ferromagnetic metal layer 23. In addition, the cap layer 24 contributes also to the crystal orientation of each layer of the magnetoresistance effect element part 20. As a result, by disposing the cap layer 24, the magnetization of the second ferromagnetic metal layer 21 and the first ferromagnetic metal layer 23 of the magnetoresistance effect element part 20 is stabilized, and the resistance of the magnetoresistance effect element part 20 can be lowered.

It is preferable to use a material having high conductivity for the cap layer 24. For example, Ru, Ta, Cu, Ag, or Au may be used. It is preferable to appropriately set the crystal structure of the cap layer 24 from an fcc structure, an hcp structure, and a bcc structure in accordance with the crystal structure of the adjacent ferromagnetic metal layer.

In addition, for the cap layer 24, it is preferable to use any one selected from a group made of silver, copper, magnesium, and aluminum. While details will be described later, in a case in which the spin-orbit torque wiring 40 and the magnetoresistance effect element part 20 are connected through the cap layer 24, it is preferable for the cap layer 24 not to disperse spin propagating from the spin-orbit torque wiring 40. It is known that silver, copper, magnesium, aluminum, and the like have long spin dispersion lengths of 100 nm or more, and thus, it is unlikely to disperse the spin.

The thickness of the cap layer 24 is preferably a spin diffusion length of the material composing the cap layer 24 or less. In a case in which the thickness of the cap layer 24 is the spin diffusion length or less, spin propagating from the spin-orbit torque wiring 40 can be sufficiently delivered to the magnetoresistance effect element part 20.

<Spin-orbit torque wiring>

The spin-orbit torque wiring 40 extends in a direction intersecting the lamination direction of the magnetoresistance effect element part 20 and is bonded to the first ferromagnetic metal layer 23. The spin-orbit torque wiring 40 is electrically connected to a power supply causing a current to flow through the spin-orbit torque wiring 40 in a direction intersecting the lamination direction of the magnetoresistance effect element part 20 and functions as a spin injecting means for injecting a pure spin particle to the magnetoresistance effect element part 20 together with the power supply.

The spin-orbit torque wiring 40 may be either directly connected to the first ferromagnetic metal layer 23 or connected thereto through another layer, for example, as illustrated in FIG. 5, through the cap layer 24.

The spin-orbit torque wiring 40 includes a material generating a pure spin current in accordance with a spin Hall effect when a current flows through it. As such a material, a material having a composition causing a pure spin current to be generated in the spin-orbit torque wiring may be used. Thus, the spin-orbit torque wiring 40 is not limited to a material made of a single element but may be formed from a material with a portion composed using a material generating a pure spin current and a portion composed using a material not generating a pure spin current or the like.

The spin Hall effect is a phenomenon in which a pure spin current is caused in a direction orthogonal to the direction of the current on the basis of a spin-orbit interaction in a case in which a current flows through the material.

Figure 6:
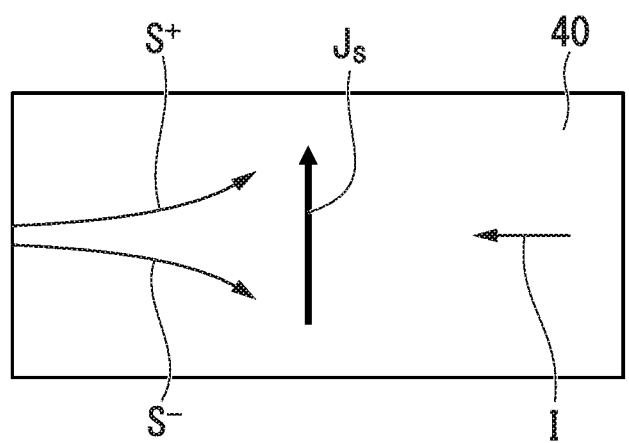
FIG. 6 is a schematic view illustrating a spin Hall effect.

FIG. 6 is a schematic view illustrating a spin Hall effect. A mechanism in which a pure spin current is generated in accordance with the spin Hall effect will be described on the basis of FIG. 6.

As illustrated in FIG. 6, when a current 1 flows in the extending direction of the spin-orbit torque wiring 40, each of upward spin $S^+$ and downward spin $S^-$ bends in a direction orthogonal to the current. Although a general Hall effect and the spin Hall effect are common in that moving electric charge (electron) bends the moving (motion) direction, while charged particles moving inside a magnetic field bends the moving direction by receiving a Lorentz force in the general Hall effect, the moving direction bends in accordance with only the movement of electrons (only the flow of a current) under no presence of a magnetic field in the spin Hall effect, which is different from the case of the general Hall effect.

In a nonmagnetic substance (a material that is not a ferromagnetic body), the number of electrons having upward spin $S^+$ and the number of electrons having downward spin $S^-$ are the same, and thus the number of electrons having upward spin $S^+$ facing toward the upper side in the drawing and the number of electrons having downward spin $S^-$ facing the lower side are the same. For this reason, a current as a net flow of electric charge is zero. A spin current not accompanying this current is particularly called a pure spin current.

On the other hand, while it is common that, also in a case in which a current flows in a ferromagnetic body, upward-spin electrons and downward-spin electrons are bent in opposite directions, there is a difference in that, in the ferromagnetic body, one side of upward-spin electrons and downward-spin electrons are extremely large, and thus, as a result, a net flow of electric charges particles occurs (a voltage is generated). Thus, in the material of the spin-orbit torque wiring, a material formed only from a ferromagnetic body is not included.

Here, when the flow of electrons having upward spin $S^+$ is denoted by $J_\uparrow$, the flow of electrons having downward spin $S^-$ is denoted by $J_\downarrow$, and a spin current is denoted by $J_S$, the spin current is defined as $J_S = J_\uparrow - J_\downarrow$. In the case illustrated in FIG. 6, $J_S$ flows in the upper direction in the drawing as a pure spin current. Here, $J_S$ is the flow of electrons in which polarizability is 100%.

In the case illustrated in FIG. 6, when a ferromagnetic body is brought into contact with an upper face of the spin-orbit torque wiring 40, the pure spin current diffuses and flows into the ferromagnetic body.

In the spin current magnetization rotational element according to the present disclosure, a pure spin current is generated by causing a current to flow through the spin-orbit torque wiring in this way, and the pure spin current is configured to diffuse into the first ferromagnetic metal layer that is in contact with the spin-orbit torque wiring, whereby a spin-orbit torque (SOT) effect according to the pure spin current contributes to the magnetization reversal of the first ferromagnetic metal layer that is a free layer.

The spin current magnetization rotational element according to the present disclosure, in other words, an element performing magnetization reversal of a ferromagnetic metal layer using an SOT effect according to a pure spin current may be used as a means for assisting magnetization reversal of the ferromagnetic metal layer or a main force means thereof in a conventional magnetoresistance effect element part using the STT or may be used in a new magnetoresistance effect element part performing magnetization reversal of a ferromagnetic metal layer using only the SOT according to the pure spin current.

As methods of assisting the magnetization reversal, a method of applying an external magnetic field, a method of applying a voltage, a method of adding heat, and a method using distortion of a material are known. However, in the case of the method of applying an external magnetic field, the method of applying a voltage, or the method of applying heat, it is necessary to arrange new wirings, a heat generation source, and the like to the outside, and the element configuration is complex. In the case of the method using distortion of a material, it is difficult to control distortion that has occurred in a use form, and magnetization reversal cannot be performed with good controllability.

The spin-orbit torque wiring 40 may contain a nonmagnetic heavy metal. Here, the heavy metal is used in the meaning of a metal having a specific gravity equal to or higher than Yttrium. The spin-orbit torque wiring 40 may be formed only from a nonmagnetic heavy metal.

In this case, the nonmagnetic heavy metal is preferably a nonmagnetic metal, which has a large atomic number of 39 or more which has d-electrons or f-electrons in the outermost shell. The reason for this is that such a nonmagnetic metal has a large spin-orbit interaction causing the spin Hall effect. The spin-orbit torque wiring 40 may be formed only from a nonmagnetic metal, which has d-electrons or f-electrons in the outermost shell, having an atomic number of 39 or more.

Normally, while all the electrons move in a direction opposite to a current regardless of the orientation of the spin when the current flows through a metal, a nonmagnetic metal, which has d-electrons or f-electrons in the outermost shell, having a large atomic number has a large spin-orbit interaction and thus has a direction, in which electrons move in accordance with the spin Hall effect, to be dependent on the orientation of the spin of the electrons, whereby a pure spin current $J_S$ may be easily generated.

In addition, the spin-orbit torque wiring 40 may contain a magnetic metal. The magnetic metal represents a ferromagnetic metal or an antiferromagnetic metal. The reason for this is that, when a small amount of magnetic metal is included in the nonmagnetic metal, a spin-orbit interaction is reinforced, and spin current generation efficiency with respect to a current flowing through the spin-orbit torque wiring 40 can be increased. The spin-orbit torque wiring 40 may be formed only from an antiferromagnetic metal.

Since the spin-orbit interaction is generated in accordance with a unique inner field of the substance of the spin-orbit torque wiring material, a pure spin current is generated also in a nonmagnetic material. When a small amount of magnetic metal is added to the spin-orbit torque wiring material, since the magnetic metal scatters flowing electron spin, the spin current generation efficiency is improved. However, when the amount of addition of a magnetic metal is increased too much, the generated pure spin current is scattered by the added magnetic field, and, as a result, an action of decreasing the spin current becomes strong. Accordingly, it is preferable that the mole ratio of the added magnetic metal is much smaller than the mole ratio of the main component of a pure spin generating part of the spin-orbit torque wiring. The mole ratio of the added magnetic metal is preferably 3% or less as a reference.

The spin-orbit torque wiring 40 may contain a topological insulator. The spin-orbit torque wiring 40 may be formed only from a topological insulator. The topological insulator is a material, in which the inside is an insulator or a resistor of high resistance, having a surface in which a spin-polarized metal state occurs. In a material, an inner magnetic field called a spin-orbit interaction is present. Thus, a new topological phase is formed in accordance with the effect of the spin-orbit interaction even without an external magnetic field. This is the topological insulator, and a pure spin current can be generated with high efficiency in accordance with a strong spin-orbit interaction and destruction of inversion symmetry in the edge.

As a topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like may be preferably used. Such a topological insulator can generate a spin current with high efficiency.

<Substrate>

It is preferable that the substrate 10 have superior flatness. In order to acquire a surface having superior flatness, Si, AlTiC, or the like may be used as the material.

On a face of the substrate 10 that is disposed on the side of the magnetoresistance effect element part 20, an underlayer (not illustrated in the drawing) may be formed. By disposing the underlayer, crystallinity such as crystal alignment and a crystal grain size of each layer including the second ferromagnetic metal layer 21 stacked on the substrate 10 can be controlled.

It is preferable that the underlayer has an insulating property. The reason for this is for preventing a current flowing through the wiring 30 and the like from being scattered. As the material of the underlayer, various materials may be used.

For example, as one example of the underlayer, a layer of nitride having a (001)-aligned NaCl structure and containing at least one element selected from a group of Ti, Zr, Nb, V, Hf, Ta, Mo, W, B, Al, and Ce may be used.

As another example of the underlayer, a layer of a (002)-aligned conductive oxide of a Perovskite system represented using a compositional formula of $XYO_3$ may be used. Here, the site X includes at least one element selected from a group of Sr, Ce, Dy, La, K, Ca, Na, Pb, and Ba, and the site B includes at least one element selected from a group of Ti, V, Cr, Mn, Fe, Co, Ni, Ga, Nb, Mo, Ru, Ir, Ta, Ce, and Pb.

As another example of the underlying, a layer of an oxide having a (001)-aligned NaCl structure and containing at least one element selected from a group made of Mg, Al, and Ce may be used.

As another example of the underlayer, a layer having a (001)-aligned tetragonal crystal or cubic crystal structure and including at least one element selected from a group of Al, Cr, Fe, Co, Rh, Pd, Ag, Ir, Pt, Au, Mo, and W may be used.

The underlayer is not limited to one layer, and each exemplary layer described above may be stacked to form a plurality of layers. By devising the configuration of the underlayer, the crystallinity of each layer of the magnetoresistance effect element part 20 is increased, and the magnetic characteristics can be improved.

<Wiring>

The wiring 30 is electrically connected to the second ferromagnetic metal layer 21 of the magnetoresistance effect element part 20, and, in the case illustrated in FIG. 5, the wiring 30, the spin-orbit torque wiring 40, and the power supply (not illustrated in the drawing) configure a closed circuit, and a current flows in the lamination direction of the magnetoresistance effect element part 20.

The material of the wiring 30 is not particularly limited as long has it has high conductivity. For example, aluminum, silver, copper, gold, or the like may be used as the material.

FIGS. 7 to 10 are schematic diagrams illustrating spin-orbit torque wirings according to embodiments, (a) is a cross-sectional view, and (b) is a plan view. As a narrow portion of each of the spin-orbit torque wiring illustrated in FIGS. 7 to 10, a case of a configuration in which the narrow portion has a thickness smaller than that of portions other than the narrow portion and the same width as that of the portion other than the narrow portion is illustrated as an example.

In a magnetoresistance effect element according to the present disclosure, either in the case of a configuration in which magnetization reversal of the magnetoresistance effect element is performed using only SOT according to a pure spin current (hereinafter, it may be referred to as a "SOT-only" configuration) or in the case of a configuration in which SOT according to a pure spin current is used together in a conventional magnetoresistance effect element using the STT (hereinafter, it may be referred to as an "STT and SOT combined" configuration), a current flowing through the spin-orbit torque wiring is a normal current accompanying the flow of electric charge, and accordingly, Joule heat is generated when the current flows.

The spin-orbit torque wirings according to the embodiments illustrated in FIGS. 7 to 10 are examples of a configuration for decreasing Joule heat due to a current flowing through the spin-orbit torque wiring by using a configuration other than the materials described above.

In the "STT and SOT combined" configuration, as a current caused to flow for the magnetization reversal of the magnetoresistance effect element according to the present disclosure, in addition to a current that is caused to directly flow through the magnetoresistance effect element for using the STT effect (hereinafter, it may be referred to as an "STT inversion current"), there is a current caused to flow through the spin-orbit torque wiring for using the SOT effect (hereinafter, it may be referred to as an "SOT inversion current"). Both the currents are normal currents accompanying the flow of electric charge, and thus, when the current flows, Joule heat is generated. In this configuration, the magnetization reversal using the STT effect and the magnetization reversal using the SOT effect are used together, and thus, although the STT inversion current is lower than that of a configuration in which magnetization reversal is performed using only the STT effect, energy corresponding to the SOT inversion current is consumed.

A heavy metal that is a material that can easily generate a pure spin current has higher electrical resistance than that of a metal used for a general wiring.

For this reason, from a viewpoint of decreasing Joule heat generated in accordance with the SOT inversion current, it is more preferable for the spin-orbit torque wiring to have a portion in which the electrical resistance is small rather than to be formed only using a material that can generate a pure spin current. In other words, from this viewpoint, it is preferable that the spin-orbit torque wiring be formed of a part formed using a material generating a pure spin current (spin current generating part) and a part formed using a material having electrical resistance lower than that of the spin current generating part (low resistance part).

The spin current generating part may be formed using a material that can generate a pure spin current and, for example, may have a configuration formed of parts of a plurality of kinds of materials or the like.

The spin current generating part may be made of a material selected from a group of tungsten, rhenium, osmium, iridium and an alloy including at least one of such metals. Here, each of tungsten, rhenium, osmium, and iridium has 5d-electrons in the outermost shell and has a large orbital angular momentum in a case in which five orbits of the d orbital are degenerated. For this reason, a spin-orbit interaction causing the spin Hall effect becomes strong, and a spin current can be efficiently generated.

For the low resistance part, a material that is used for a general wiring may be used. For example, aluminum, silver, copper, gold, or the like may be used as the material. The low resistance part may be made of a material having lower electrical resistance than the spin current generating part and, for example, may have a configuration formed of parts of a plurality of kinds of materials or the like.

In the low resistance part, a pure spin current may be generated. In such a case, differentiation between the spin current generating part and the low resistance part can be performed by determining that a part formed using a material described as the material of the spin current generating part or the low resistance part in this specification is the spin current generating part or the low resistance part. In addition, a part, which is a part other than a main part generating a pure spin current, having electrical resistance lower than the main part can be determined as a low resistance part to be differentiated from the spin current generating part.

The spin current generating part may contain a nonmagnetic heavy metal. In such a case, the heavy metal that can generate a pure spin current may be contained with a limitation. Furthermore, in this case, it is preferable that the spin current generating part be a density area in which a heavy metal that can generate a pure spin current is much smaller than the main component of the spin current generating part, or a heavy metal that can generate a pure spin current be a main component, for example, a mole ratio of 90% or more. In this case, it is preferable that the heavy metal that can generate a pure spin current be 100% of a nonmagnetic metal, in which d-electrons or f-electrons are included in the outermost shell, having an atomic number 39 or more.

Here, the density area in which the heavy metal that can generate the pure spin current is much smaller than the main component of the spin current generating part, for example, represents the density of the heavy metal in the spin current generating part having copper as its main component being a mole ratio of 10% or less. In a case in which the main component composing the spin current generating part is made of a material other than the heavy metal described above, the density of the heavy metal contained in the spin current generating part is preferably 50% or less and is more preferably 10% or less. Such a density area is an area in which the effect of spin scattering of electrons can be acquired effectively. In a case in which the density of the heavy metal is low, a light metal having an atomic number less than that of the heavy metal is the main component of the spin current generating part. In addition, in this case, it is assumed that atoms of heavy metal disorderly disperse in the light metal instead of the heavy metal forming an alloy with the light metal. In the light metal, since the spin-orbit interaction is weak, it is difficult to generate a pure spin current using a spin Hall effect. However, when electrons pass through a heavy metal included in a light metal, there is an effect of scattering spin also in the interface between the light metal and the heavy metal, and accordingly, a pure spin current can be efficiently generated also in an area in which the density of the heavy metal is low. In a case in which the density of the heavy metal exceeds 50%, although the ratio of the spin Hall effect in the heavy metal increases, the effect of the interface between the light metal and the heavy metal reduces, and accordingly, a comprehensive effect reduces. Accordingly, the density of the heavy metal to such a degree at which a sufficient effect of the interface can be expected is preferable.

In addition, in a case in which the spin-orbit torque wiring described above includes a magnetic metal, the spin current generating part of the spin-orbit torque wiring may be made of an antiferromagnetic metal. By using the antiferromagnetic metal, the same effect as that of a case in which a 100% nonmagnetic metal, which has d-electrons or f-electrons in the outermost shell, of an atomic number 39 or more is used as a heavy metal can be acquired. The antiferromagnetic metal, for example, is preferably IrMn or PtMn and is more preferably IrMn that is stable for heat.

In a case in which the spin-orbit torque wiring described above includes a topological insulator, the spin current generating part of the spin-orbit torque wiring may be formed of a topological insulator. As the topological insulator, for example, SnTe, $Bi_{1.5}Sb_{0.5}Te_{1.7}Se_{1.3}$, TlBiSe$_2$, $Bi_2Te_3$, $(Bi_{1-x}Sb_x)_2Te_3$, or the like is preferable. Such a topological insulator can generate a spin current with high efficiency.

In order for the pure spin current generated in the spin-orbit torque wiring to effectively diffuse into the magnetoresistance effect element part, it is necessary for at least a part of the spin current generating part is in contact with the first ferromagnetic metal layer. In a case in which a cap layer is included, at least a part of the spin current generating part needs to be in contact with the cap layer. All the embodiments of the spin-orbit torque wirings illustrated in FIGS. 7 to 10 have a configuration in which at least a part of the spin current generating part is in contact with the first ferromagnetic metal layer.

Figure 7:
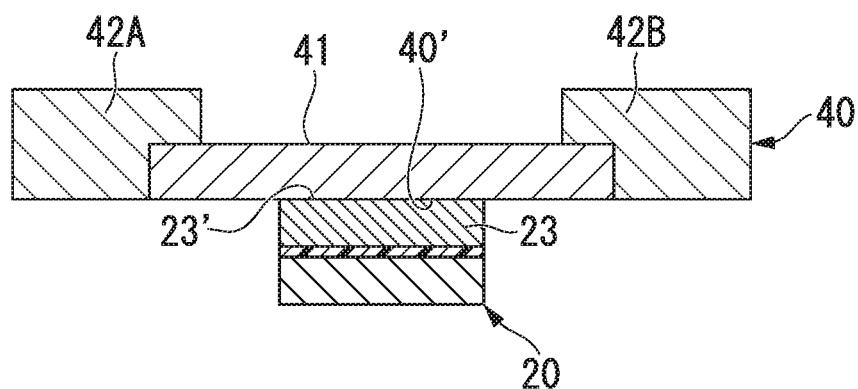
FIG. 7 is a schematic diagram illustrating a spin-orbit torque wiring of a spin current magnetization rotational element according to one embodiment of the present disclosure, (a) is a cross-sectional view, and (b) is a plan view.
Figure 7:
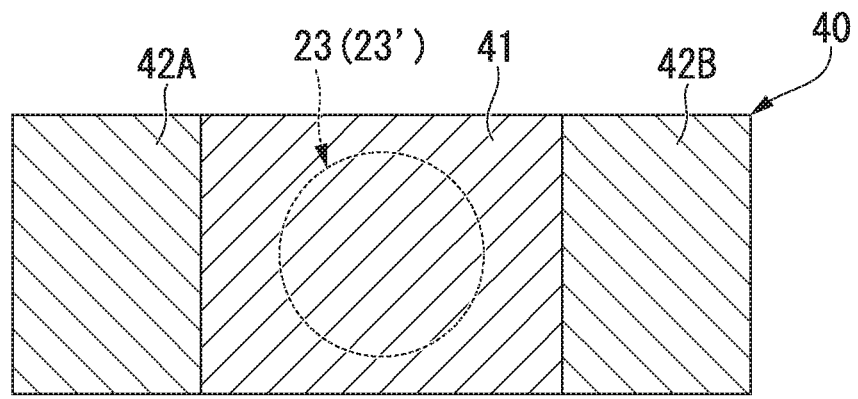

In the embodiment illustrated in FIG. 7, the whole junction 40' of the spin-orbit torque wiring 40 for the first ferromagnetic metal layer is made of a spin current generating part 41, and the spin current generating part 41 is configured to be interposed between low resistance parts 42A and 42B. In addition, the spin-orbit torque wiring 40 illustrated in FIG. 7 has a configuration in which the narrow portion is a part of the spin current generating part 41. Furthermore, in the spin-orbit torque wiring 40 illustrated in FIG. 7 has a configuration in which a junction of the spin-orbit torque wiring 40 for the first ferromagnetic metal layer 23 is a part of the spin current generating part 41.

In the narrow portion included in the spin-orbit torque wiring 40 illustrated in FIG. 7, a junction that is a part thereof is in contact with a face of the first ferromagnetic metal layer 23. A current flowing through the spin-orbit torque wiring 40 has a current density increased in the narrow portion, and the density of the generated pure spin current is increased. The high-density pure spin current promotes greater magnetization reversal of the first ferromagnetic metal layer 23 than in a case having no narrow portion.

In a case in which the spin current generating part 41 and the low resistance parts 42A and 42B are disposed in parallel with each other, a current flowing through the spin-orbit torque wiring 40 is divided at the reciprocal ratio of magnitudes of the resistance of the spin current generating part and the resistance of the low resistance part, and the divided current flows through each part.

From the viewpoint of the pure spin current generation efficiency with respect to the SOT inversion current, in order to cause all the current flowing through the spin-orbit torque wiring to flow through the spin current generating part, both the spin current generating part and the low resistance part are disposed electrically in series without having a portion in which are disposed in parallel with each other.

Spin-orbit torque wirings illustrated in FIGS. 7 to 10 have a configuration not having a portion in which the spin current generating part and the low resistance part are disposed electrically in parallel with each other in the plan view in the lamination direction of a magnetoresistance effect element part and is in the case of a configuration having highest efficiency of generation of a pure spin current with respect to an SOT inversion current among configurations having a cross-section illustrated in (a).

In a spin-orbit torque wiring 40 illustrated in FIG. 7, a spin current generating part 41 thereof overlaps a junction 23' of a first ferromagnetic metal layer 23 to be included therein in the plan view from the lamination direction of a magnetoresistance effect element part 20. In addition, the thickness direction thereof is formed only from the spin current generating part 41, and low resistance parts 42A and 42B are configured to be disposed to have the spin current generating part 41 interposed therebetween in a direction in which the current flows. As a modified example of the spin-orbit torque wiring illustrated in FIG. 7, there is a configuration in which a spin current generating part overlap a junction to a first ferromagnetic metal layer in the plan view from the lamination direction of the magnetoresistance effect element part, and the other configurations are the same as those of the spin-orbit torque wiring illustrated in FIG. 7.

Figure 8:
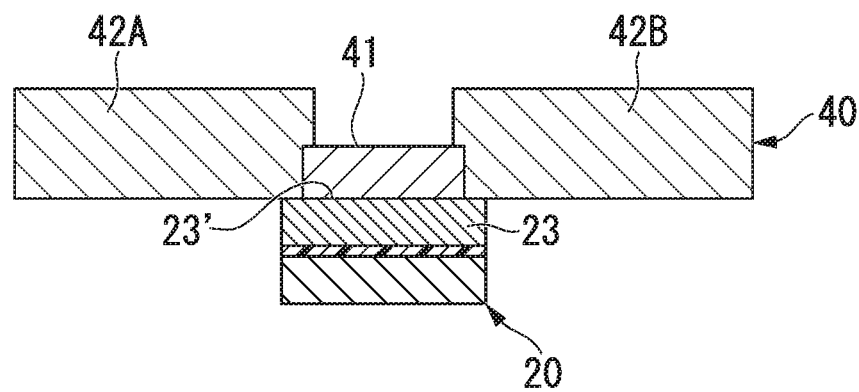
FIG. 8 is a schematic diagram illustrating a spin-orbit torque wiring of a spin current magnetization rotational element according to another embodiment of the present disclosure, (a) is a cross-sectional view, and (b) is a plan view.
Figure 8:
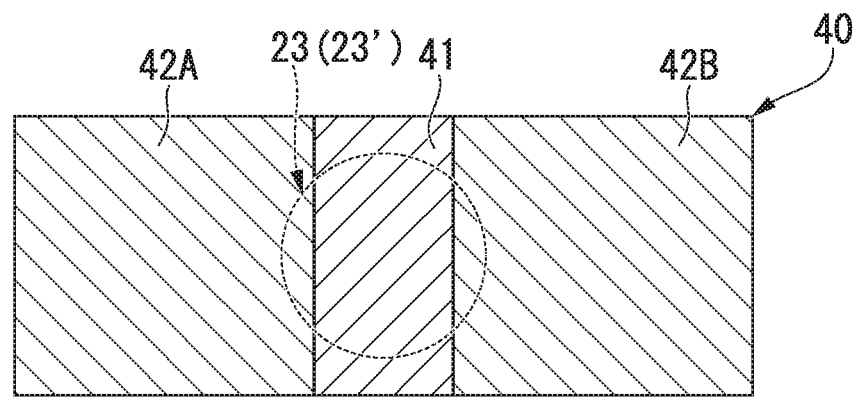

A spin-orbit torque wiring 40 illustrated in FIG. 8 has a configuration in which a spin current generating part 41 thereof overlaps a part of a junction 23' of a first ferromagnetic metal layer 23 in the plan view from the lamination direction of a magnetoresistance effect element part 20, the thickness direction is formed only from the spin current generating part 41, and low resistance parts 42A and 42B are disposed to have the spin current generating part 41 interposed therebetween in a direction in which the current flows. In addition, the spin-orbit torque wiring 40 illustrated in FIG. 8 has a configuration in which the narrow portion thereof is a part of the spin current generating part 41. Furthermore, the spin-orbit torque wiring 40 illustrated in FIG. 8 has a configuration in which a junction of the spin-orbit torque wiring 40 for the first ferromagnetic metal layer is a part of the spin current generating part 41.

In the narrow portion included in the spin-orbit torque wiring 40 illustrated in FIG. 8, the junction that is a part thereof is bonded to a face of the first ferromagnetic metal layer 23. A current flowing through the spin-orbit torque wiring has a current density increased in the narrow portion, and the density of the generated pure spin current is increased. The high-density pure spin current promotes greater magnetization reversal of the first ferromagnetic metal layer than in a case having no narrow portion.

Figure 9:
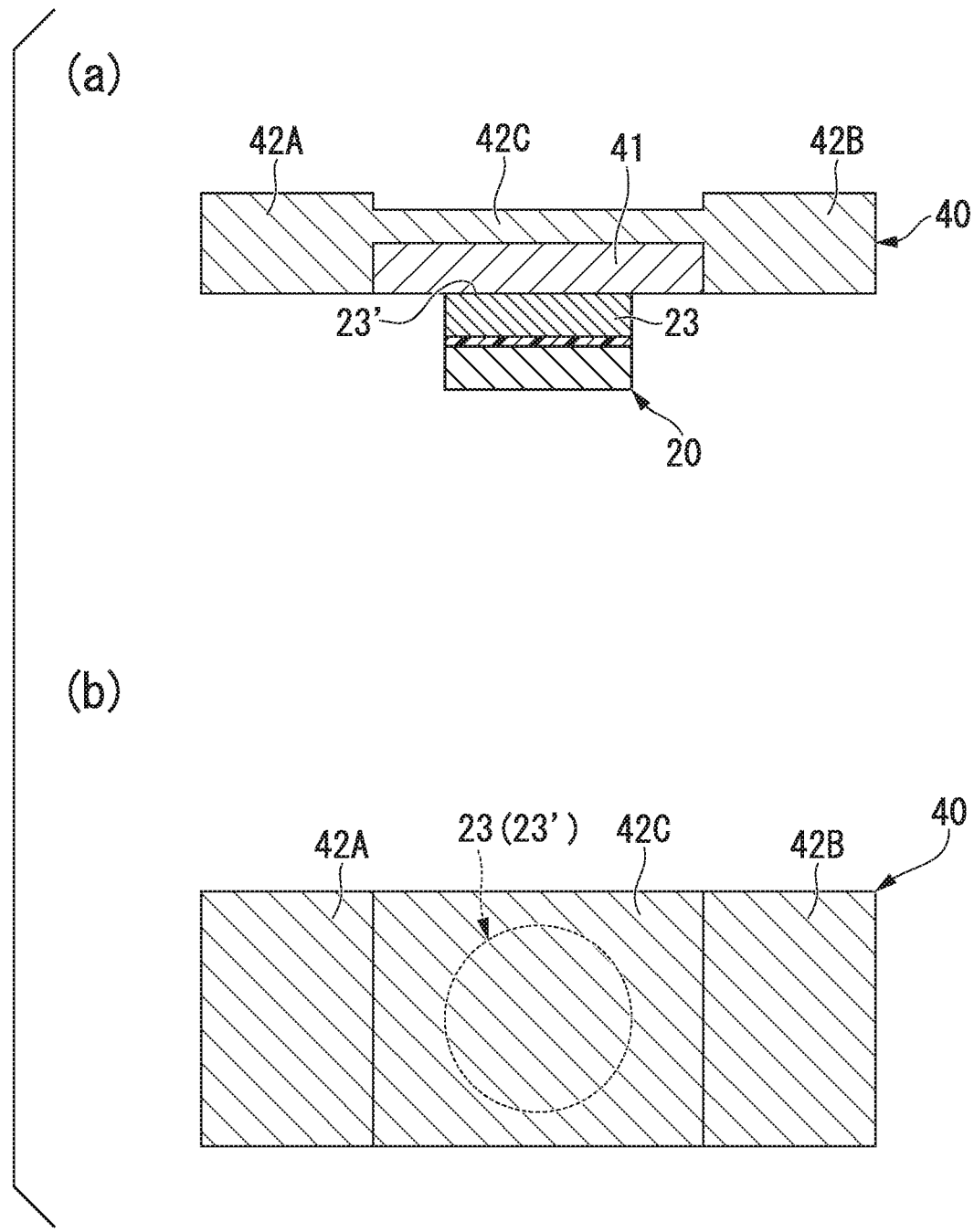
FIG. 9 is a schematic diagram illustrating a spin-orbit torque wiring of a spin current magnetization rotational element according to another embodiment of the present disclosure, (a) is a cross-sectional view, and (b) is a plan view.

A spin-orbit torque wiring 40 illustrated in FIG. 9 has a configuration in which a spin current generating part 41 thereof overlaps a junction 23' of a first ferromagnetic metal layer 23 to be included therein in the plan view from the lamination direction of a magnetoresistance effect element part 20, in the thickness direction thereof, the spin current generating part 41 and low resistance part 43 are sequentially stacked from the first ferromagnetic metal layer side, and the low resistance parts 42A and 42B are disposed to have a portion, in which the spin current generating part 41 and the low resistance part 42C are stacked, interposed therebetween in the direction in which the current flows. In addition, the spin-orbit torque wiring 40 illustrated in FIG. 9 has a configuration in which a part of the narrow portion thereof is the spin current generating part 41. Furthermore, the spin-orbit torque wiring 40 illustrated in FIG. 9 has a configuration in which a junction of the spin-orbit torque wiring 40 for the first ferromagnetic metal layer is a part of the spin current generating part 41 and the low resistance part 42C.

In the narrow portion included in the spin-orbit torque wiring 40 illustrated in FIG. 9, the junction that is a part thereof is bonded to a face of the first ferromagnetic metal layer 23. A current flowing through the spin-orbit torque wiring has a current density increased in the narrow portion, and the density of the generated pure spin current is increased. The high-density pure spin current promotes greater magnetization reversal of the first ferromagnetic metal layer than in a case having no narrow portion.

As a modified example of the spin-orbit torque wiring illustrated in FIG. 9, there is a configuration in which a spin current generating part overlap a junction of a first ferromagnetic metal layer in the plan view from the lamination direction of the magnetoresistance effect element part, and the others are the same as those of the spin-orbit torque wiring illustrated in FIG. 9.

Figure 10:
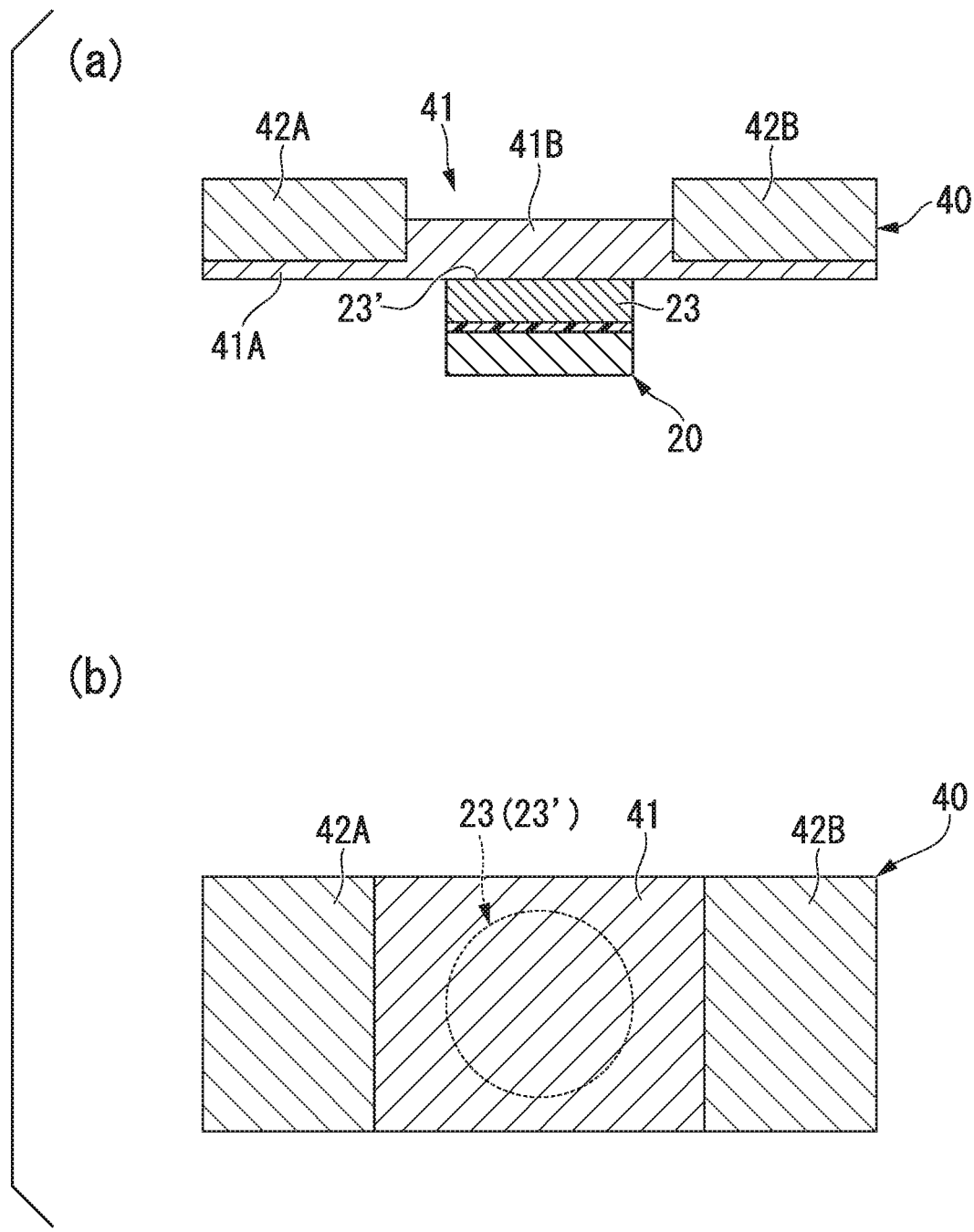
FIG. 10 is a schematic diagram illustrating a spin-orbit torque wiring of a spin current magnetization rotational element according to another embodiment of the present disclosure, (a) is a cross-sectional view, and (b) is a plan view.

A spin-orbit torque wiring 40 illustrated in FIG. 10 has a configuration in which a spin current generating part 41 overlaps to include a first spin current generating part 41A formed on the whole face on the first ferromagnetic metal layer and a junction 23' of a first ferromagnetic metal layer 23 stacked on the first spin current generating part 41A in the plan view from the lamination direction of a magnetoresistance effect element part 20, and the thickness direction is formed of a second spin current generating part 41B formed only from the spin current generating part and low resistance parts 42A and 42B disposed to have the second spin current generating part 41B interposed therebetween in a direction in which the current flows. In addition, the spin-orbit torque wiring 40 illustrated in FIG. 10 has a configuration in which a part of the narrow portion thereof is a part of the spin current generating part 41. Furthermore, the spin-orbit torque wiring 40 illustrated in FIG. 10 has a configuration in which a junction of the spin-orbit torque wiring 40 for the first ferromagnetic metal layer 23 is a part of the spin current generating part 41.

In the narrow portion included in the spin-orbit torque wiring 40 illustrated in FIG. 10, the junction that is a part thereof is bonded to a face of the first ferromagnetic metal layer 23. A current flowing through the spin-orbit torque wiring 40 has a current density increased in the narrow portion, and the density of the generated pure spin current is increased. The high-density pure spin current promotes greater magnetization reversal of the first ferromagnetic metal layer 23 than in a case having no narrow portion.

As a modified example of the spin-orbit torque wiring illustrated in FIG. 10, there is a configuration in which a second spin current generating part overlaps a junction of a second ferromagnetic metal layer in the plan view from the lamination direction of a magnetoresistance effect element part, and the others are the same as those of the spin-orbit torque wiring illustrated in FIG. 10.

In the configuration illustrated in FIG. 10, since an area in which the spin current generating part 41 and the low resistance parts 42A and 42B are in contact with each other is large, the adhesiveness between a nonmagnetic metal, which has a large atomic number, composing the spin current generating part 41 and metals composing the low resistance parts 42A and 42B is high.

The magnetoresistance effect element according to the present disclosure can be formed using a known method. Hereinafter, methods of manufacturing the magnetoresistance effect elements illustrated in FIGS. 7 to 10 will be described.

First, the magnetoresistance effect element part 20, for example, may be formed using a magnetron sputtering device. In a case in which the magnetoresistance effect element part 20 is a TMR element, for example, a tunnel barrier layer is formed by, first, sputtering aluminum of about 0.4 to 2.0 nm and a plurality of metal thin films of bivalent positive ions of nonmagnetic elements on the first ferromagnetic metal layer, naturally oxidizing the metal films through plasma oxidation or introduction of oxygen, and performing a thermal treatment thereafter. As a method of forming films, a thin film forming method such as an evaporation method, a laser ablation method, or an MBE method in addition to a magnetron sputtering method may be used.

After film formation and shape formation of the magnetoresistance effect element part 20 are performed, it is preferable to form the spin current generating part 41, first. The reason for this is that employing a structure that can suppress scattering of a pure spin current from the spin current generating part 41 to the magnetoresistance effect element part 20 as much as possible leads to high efficiency.

After the film formation and the shape formation of the magnetoresistance effect element part 20 are performed, by filling the periphery of the magnetoresistance effect element part 20 after processing with a resist or the like, faces including an upper face of the magnetoresistance effect element part 20 are formed. At this time, it is preferable to flatten the upper face of the magnetoresistance effect element part 20. By performing the flattening, spin scattering on the interface between the spin current generating part 41 and the magnetoresistance effect element part 20 can be suppressed.

Next, a material of the spin current generating part 41 is formed on the upper face of the flattened magnetoresistance effect element part 20 as a film. For the film formation, sputtering or the like may be used.

Next, a resist or a protection film is disposed in a portion in which the spin current generating part 41 is to be manufactured, and an unnecessary part is removed using an ion milling method or a reactive ion etching (RIE) method.

Next, a material composing the low resistance parts 42A, 42B, and 42C is formed as a film through sputtering or the like, and the resist or the like is peeled off, whereby the spin-orbit torque wiring 40 is manufactured. In a case in which the shape of the spin current generating part 41 is complex, the formation of the resist or the protection film and the film formation of the spin current generating part 41 may be performed in a divisional manner for a plurality of number of times.

Figure 11:
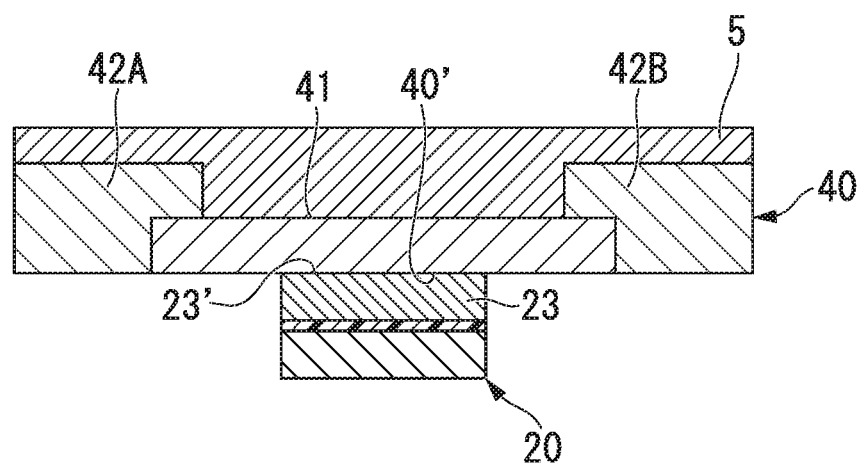
FIG. 11 is a cross-sectional schematic view illustrating a configuration in which an insulating layer 5 is formed on a face on a side opposite to a face on which a first ferromagnetic metal layer of a spin-orbit torque wiring 40 is formed in the configuration illustrated in FIG. 7.

FIG. 11 illustrates a configuration in which, in the configuration illustrated in FIG. 7, an insulating layer 5 is formed on a face of a spin-orbit torque wiring 40 on a side opposite to a face on which a first ferromagnetic metal layer 23 is formed.

In the spin current magnetization rotational element and the magnetoresistance effect element according to the present disclosure, while a configuration is employed in which the current density in the narrow portion of the spin-orbit torque wiring 40 is increased, and a pure spin current having a high density is caused to flow in the first ferromagnetic metal layer 23, in order to dam a route in which the current leaks from the spin-orbit torque wiring 40, the insulating layer 5 is formed on the face of the spin-orbit torque wiring on the side opposite to the face on which the first ferromagnetic metal layer 23 is formed.

On the face side of the spin-orbit torque wiring 40 bonded to the first ferromagnetic metal layer 23, in the element, by forming an interlayer insulating film, the current is prevented from leaking from the spin-orbit torque wiring 40.

Figure 12:
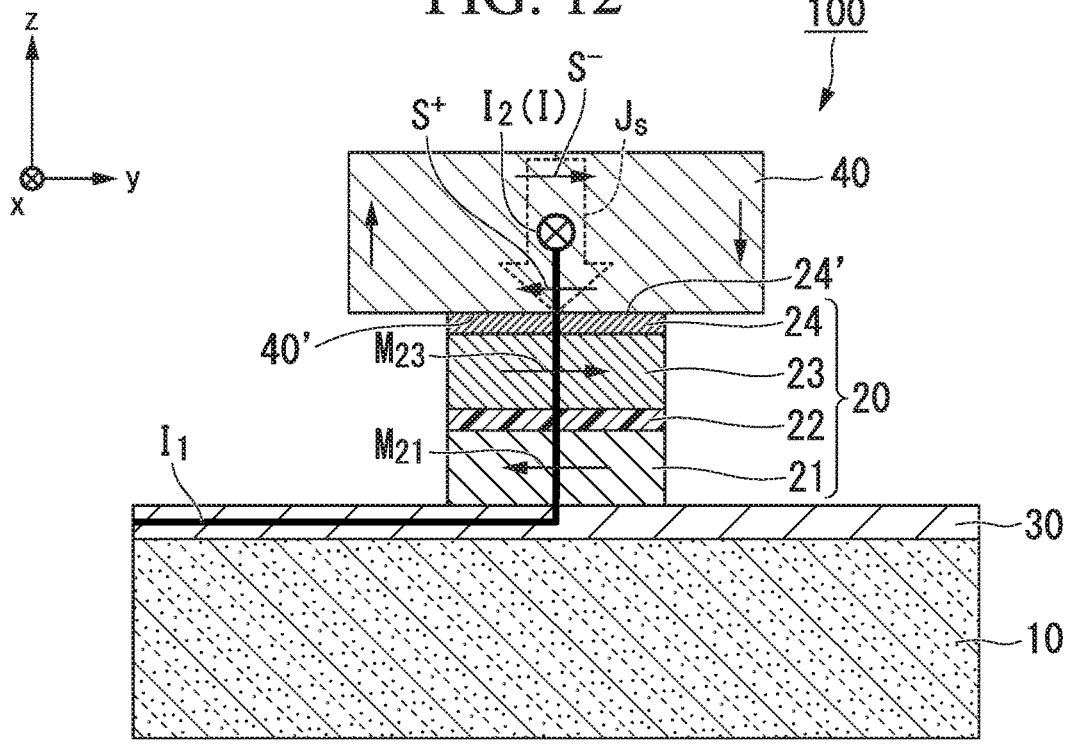
FIG. 12 is a cross-sectional schematic view of a magnetoresistance effect element according to one embodiment of the present disclosure taken along a yz plane.

FIG. 12 is a cross-sectional schematic view of a magnetoresistance effect element according to one embodiment of the present disclosure that is cut along a yz plane.

A case in which the action of the magnetoresistance effect element 100 has the "STT and SOT combined" configuration will be described with reference to FIG. 12.

As illustrated in FIG. 12, in the magnetoresistance effect element 100, there are two types of currents. One is a current $I_1$ (STT inversion current) that flows through the magnetoresistance effect element part 20 in the lamination direction and flows through the spin-orbit torque wiring 40 and the wiring 30. In the case illustrated in FIG. 12, the current $I_1$ flows through the spin-orbit torque wiring 40, the magnetoresistance effect element part 20, and the wiring 30 in this order. In this case, electrons flow in the order of the wiring 30, the magnetoresistance effect element part 20, and the spin-orbit torque wiring 40.

The other one is a current $I_2$ (SOT inversion current) that flows in the extending direction of the spin-orbit torque wiring 40.

The current $I_1$ and the current $I_2$ intersect (orthogonal intersect) each other, and, in a portion in which the magnetoresistance effect element part 20 and the spin-orbit torque wiring 40 are bonded (a reference sign 24' represents a junction of the magnetoresistance effect element part 20 (cap layer 24) side, and a reference sign 40' represents a junction of the spin-orbit torque wiring 40 side), a current flowing through the magnetoresistance effect element part 20 and a current flowing through the spin-orbit torque wiring 40 merge or are distributed In accordance with the flow of the current $I_1$, electrons having spin toward the same direction as that of the magnetization of the second ferromagnetic metal layer (magnetization fixed layer) 21 pass through the nonmagnetic layer 22 from the second ferromagnetic metal layer (magnetization fixed layer) 21 with the direction of the spin maintained, and these electrons act torque (STT) causing the orientation of magnetization $M_{23}$ of the first ferromagnetic metal layer (magnetization free layer) 23 to be reversed and be in parallel with the orientation of magnetization $M_{21}$ of the second ferromagnetic metal layer (magnetization fixed layer) 21.

Meanwhile, the current $I_2$ corresponds to the current I illustrated in FIG. 6. In other words, when the current $I_2$ flows, a pure spin current $J_S$ is generated when upward spin $S^+$ and downward spin $S^-$ are bent toward the end portion of the spin-orbit torque wiring 40. The pure spin current $J_s$ is induced in a direction perpendicular to the direction in which the current $I_2$ flows. In other words, the pure spin current $J_s$ is generated in a z-axis direction and a y-axis direction in FIG. 12. In FIG. 6, only a pure spin current $J_s$ in the z-axis direction contributing to the orientation of the magnetization of the first ferromagnetic metal layer 23 is illustrated.

The pure spin current $J_s$ generated by causing the current $I_2$ to flow through the spin-orbit torque wiring 40 from the front side toward the rear side of FIG. 12 diffuses and flows into the first ferromagnetic metal layer 23 through the cap layer 24, and the flown-in spin has an influence on the magnetization $M_{23}$ of the first ferromagnetic metal layer 23. In other words, in the case illustrated in FIG. 12, when spin toward a −y direction flows into the first ferromagnetic metal layer 23, torque (SOT) causing magnetization reversal of the magnetization $M_{23}$ of the first ferromagnetic metal layer 23 toward a +y direction is applied.

As above, an SOT effect according to a pure spin current $J_s$ occurring in accordance with a current flowing through a second current path $I_2$ is added to an STT effect occurring in accordance with a current flowing through a first current path $I_1$, and thus, the magnetization $M_{23}$ of the first ferromagnetic metal layer 23 is reversed.

When the magnetization of the first ferromagnetic metal layer 23 is to be reversed using only the STT effect (a current flows only through the current path $I_1$), it is necessary to apply a predetermined voltage or more to the magnetoresistance effect element part 20. Although a general driving voltage of a TMR element is relatively low as being several Volts or less, the nonmagnetic layer 22 is a very thin film of about several nm, and insulation destruction may occur therein. When the conduction of the nonmagnetic layer 22 is continued, a weak portion (poor film quality, a thin film thickness, or the like) of the nonmagnetic layer is destroyed in a probabilistic manner.

The magnetoresistance effect element of the case of the "STT and SOT combined" configuration according to the present disclosure uses an SOT effect in addition to an STT effect. In this way, a voltage applied to the magnetoresistance effect element part can be decreased, and the current density of a current flowing through the spin-orbit torque wiring can be decreased. By decreasing the voltage applied to the magnetoresistance effect element part, a longer life of the element can be accomplished. In addition, by decreasing the current density of the current flowing through the spin-orbit torque wiring, a marked decrease in energy efficiency can be avoided.

It is preferable that the current density of the current flowing through the spin-orbit torque wiring be less than $1 \times 10^7 A/cm^2$. When the current density of the current flowing through spin-orbit torque wiring is too high, heat is generated in accordance with the current flowing through the spin-orbit torque wiring. When heat is applied to the first ferromagnetic metal layer, the stability of magnetization of the first ferromagnetic metal layer disappears, and there are cases in which unexpected magnetization reversal or the like may occur. When such unexpected magnetization reversal occurs, there is a problem in that recorded information is rewritten. In other words, in order to avoid unexpected magnetization reversal, it is preferable that the current density of the current flowing through spin-orbit torque wiring becomes not too high. When the current density of the current flowing through the spin-orbit torque wiring is less than $1 \times 10^7 A/cm^2$, at least the occurrence of magnetization reversal according to generated heat can be avoided.

Figure 13:
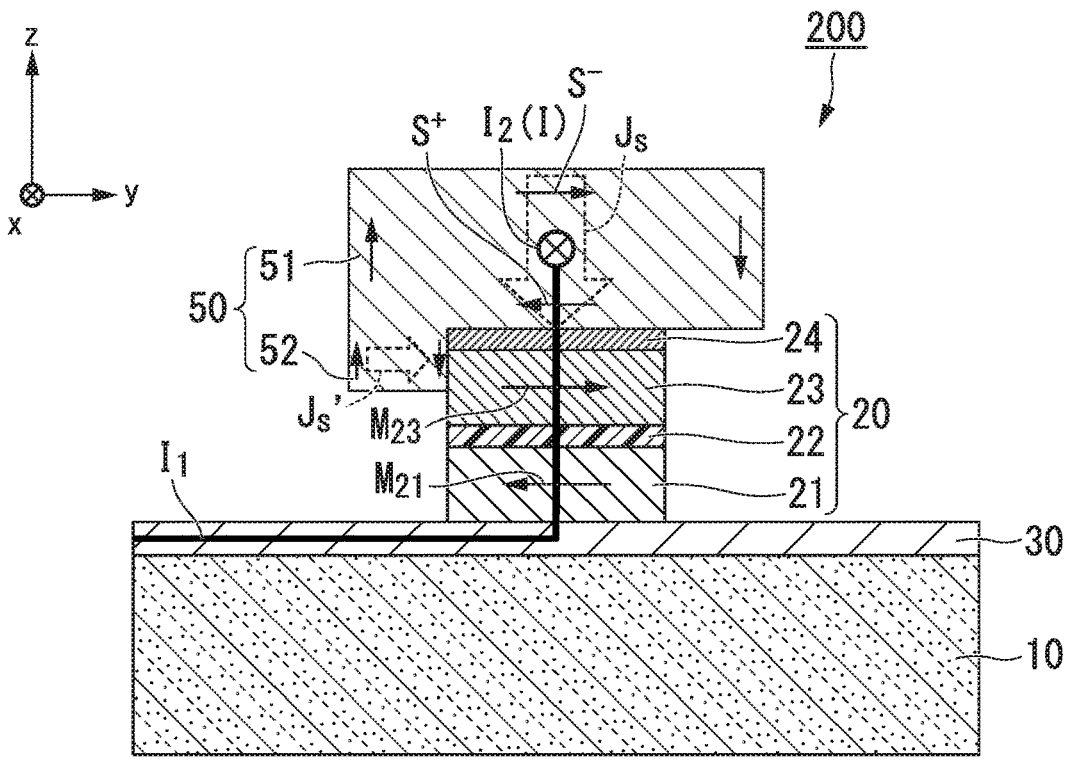
FIG. 13 is a cross-sectional schematic view of a magnetoresistance effect element according to another embodiment of the present disclosure taken along a yz plane.

FIG. 13 illustrates an example of a magnetoresistance effect element having another "STT and SOT combined" configuration according to the present disclosure.

In the magnetoresistance effect element 200 illustrated in FIG. 13, the spin-orbit torque wiring 50 includes a side wall junction 52 bonded to a side wall of a first ferromagnetic metal layer 23 in addition to an upper-face junction 51 (corresponding to the spin-orbit torque wiring 40 described above) provided in the lamination direction of a magnetoresistance effect element part 20.

When a current flows through the spin-orbit torque wiring 50, a pure spin current $J_{s'}$ is generated in the side-wall junction 52 in addition to a pure spin current $J_s$ generated in the upper-face junction 51.

Thus, not only the pure spin current $J_s$ flows from the upper face of the magnetoresistance effect element part 20 to the first ferromagnetic metal layer 23 through the cap layer 24, but also the pure spin current $J_{s'}$ flows from the side wall of the first ferromagnetic metal layer 23, whereby the SOT effect is reinforced.

In the magnetoresistance effect element 100 according to this embodiment illustrated in FIG. 5, while a so-called bottom pin structure in which the first ferromagnetic metal layer 23 that is stacked later and is disposed on a side far from the substrate 10 is set as a magnetization free layer, and the second ferromagnetic metal layer 21 that is stacked first and is disposed on a side close to the substrate 10 is set as a magnetization fixed layer (pin layer) has been described as an example, the structure of the magnetoresistance effect element 100 is not particularly limited and may be a so-called top pin structure.

Figure 14:
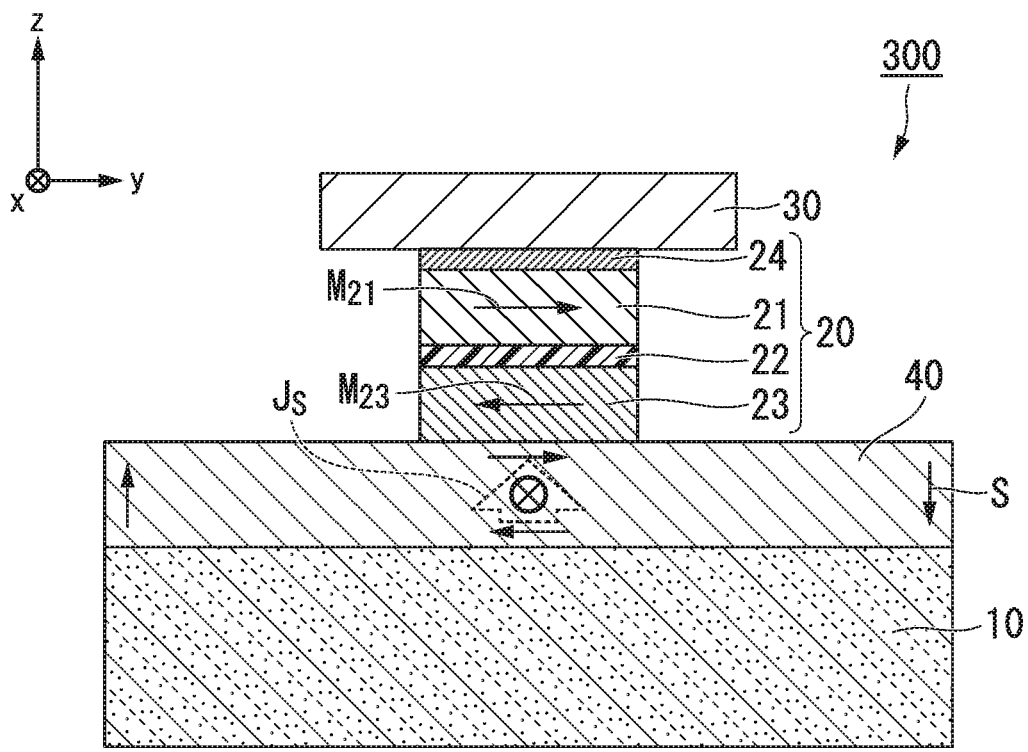
FIG. 14 is a cross-sectional schematic view of a magnetoresistance effect element according to another embodiment of the present disclosure taken along a yz plane.

FIG. 14 illustrates a magnetoresistance effect element according to another embodiment of the present disclosure.

In the magnetoresistance effect element 300 illustrated in FIG. 14, a spin-orbit torque wiring 40 is included on the substrate 10 side. In this case, the stacking order of a second ferromagnetic metal layer 21 that is a magnetization fixed layer and a first ferromagnetic metal layer 23 that is a magnetization free layer is opposite to that of the magnetoresistance effect element 100 illustrated in FIG. 5.

In the magnetoresistance effect element 300 illustrated in FIG. 14, the substrate 10, the spin-orbit torque wiring 40, the first ferromagnetic metal layer 23, a nonmagnetic layer 22, the second ferromagnetic metal layer 21, a cap layer 24, and a wiring 30 are stacked in the mentioned order. The first ferromagnetic metal layer 23 is stacked before the second ferromagnetic metal layer 21 and thus has a lower possibility of reception of the influence of lattice distortion and the like than the magnetoresistance effect element 100. As a result, in the magnetoresistance effect element 300, vertical magnetic anisotropy of the first ferromagnetic metal layer 23 is increased. When the vertical magnetic anisotropy of the first ferromagnetic metal layer 23 is increased, the MR ratio of the magnetoresistance effect element can be increased.

Figure 15:
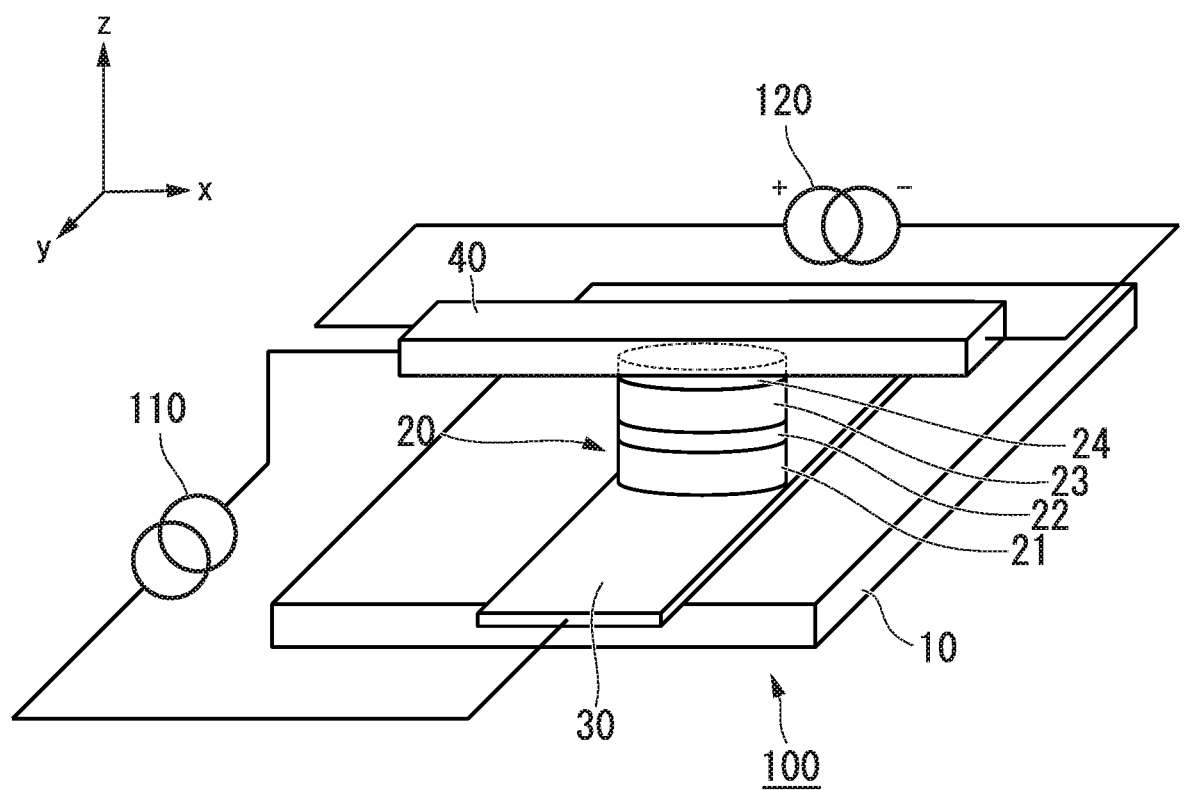
FIG. 15 is a perspective view schematically illustrating a magnetoresistance effect element according to one embodiment of the present disclosure.

FIG. 15, in the magnetoresistance effect element 100 illustrated in FIG. 5, illustrates a first power supply 110 causing a current to flow in the lamination direction of the magnetoresistance effect element part 20 and a second power supply 120 causing a current to flow through the spin-orbit torque wiring 40.

The first power supply 110 is connected to the wiring 30 and the spin-orbit torque wiring 40. The first power supply 110 can control a current flowing in the lamination direction of the magnetoresistance effect element 100.

The second power supply 120 is connected to both ends of the spin-orbit torque wiring 40. The second power supply 120 can control a current flowing through the spin-orbit torque wiring 40 that is a current flowing in a direction orthogonal to the lamination direction of the magnetoresistance effect element part 20.

As described above, the current flowing in the lamination direction of the magnetoresistance effect element part 20 induces a STT. In contrast to this, the current flowing through the spin-orbit torque wiring 40 induces a SOT. Both the STT and the SOT contributes to magnetization reversal of the first ferromagnetic metal layer.

In this way, by controlling the amounts of currents flowing in the lamination direction of the magnetoresistance effect element part 20 and in a direction perpendicular to the lamination direction using two power supplies, the contribution ratios at which the SOT and the STT contribute to magnetization reversal can be freely controlled.

For example, in a case in which a large current cannot flow through a device, the STT having high energy efficiency for magnetization reversal can be controlled to be main. In other words, the amount of current flowing from the first power supply 110 can be increased, and the amount of current flowing from the second power supply 120 can be decreased.

For example, in a case in which a thin device needs to be manufactured, and the thickness of the nonmagnetic layer 22 should be thin, it is requested to decrease a current flowing through the nonmagnetic layer 22. In this case, the amount of current flowing from the first power supply 110 is decreased, the amount of current flowing from the second power supply 120 is increased, whereby the contribution ratio of the SOT can be increased.

As the first power supply 110 and the second power supply 120, known power supplies can be used.

As described above, according to the magnetoresistance effect element in the case of the "STT and SOT combined" configuration according to the present disclosure, the contribution ratios of the STT and the SOT can be freely controlled using the amounts of currents supplied from the first power supply and the second power supply. For this reason, the contribution ratios of the STT and the SOT can be freely controlled in accordance with performance requested for the device, and the magnetoresistance effect element can function to have higher versatility.

(Magnetic memory)

A magnetic memory (MRAM) according to the present disclosure includes a plurality of magnetoresistance effect elements according to the present disclosure.

(Magnetization reversing method)

A magnetization reversing method is to cause the current density of a current flowing through the spin-orbit torque wiring to be less than $1\times10^7$ A/cm$^2$ in the magnetoresistance effect element according to the present disclosure.

When the current density of the current flowing through the spin-orbit torque wiring is too large, heat is generated in accordance with the current flowing through the spin-orbit torque wiring. When heat is applied to the first ferromagnetic metal layer, the stability of the magnetization of the first ferromagnetic metal layer disappears, and there are cases in which unexpected magnetization reversal or the like occurs. When such unexpected magnetization reversal occurs, there is a problem in that recorded information is rewritten. In other words, in order to avoid unexpected magnetization reversal, it is preferable that the current density of the current flowing through the spin-orbit torque wiring be not caused to be too large. When the current density of the current flowing through the spin-orbit torque wiring is less than $1\times10^7$ A/cm$^2$, the occurrence of magnetization reversal at least due to generated heat can be avoided.

In the magnetization reversing method, in the magnetoresistance effect element according to the present disclosure, in the case of the "STT and SOT combined" configuration, after a current is applied to the power supply of the spin-orbit torque wiring, a current may be applied to the power supply of the magnetoresistance effect element.

An SOT magnetization reversal process and an STT magnetization reversal process may be simultaneously performed, or after the SOT magnetization reversal process is performed in advance, the STT magnetization reversal process may be additionally performed. In other words, in the magnetoresistance effect element 100 illustrated in FIG. 15, currents may be simultaneously supplied from the first power supply 110 and the second power supply 120, or, after a current is supplied from the second power supply 120, a current may be additionally supplied from the first power supply 110. However, in order to acquire an effect for assisting magnetization reversal using the SOT more reliably, it is preferable to apply a current to the power supply of the magnetoresistance effect element after a current is applied to the power supply of the spin-orbit torque wiring. In other words, it is preferable that a current be supplied from the first power supply 110 after a current is supplied from the second power supply 120.

REFERENCE SIGNS LIST 1A, 1B, 1C Spin-current magnetization rotational element
2 First ferromagnetic metal layer
3, 13, 33 Spin-orbit torque wiring
3b, 13b, 33b Narrow portion
3B, 13B, 33B Junction to first ferromagnetic metal layer
10 Substrate
20 Magnetoresistance effect element part
21 Second ferromagnetic metal layer
22 Nonmagnetic layer
23 First ferromagnetic metal layer
23' Junction (on the second ferromagnetic metal layer side)
24 Cap layer
24' Junction (on the cap layer side)
30 Wiring
40, 50, 51, 52 Spin-orbit torque wiring
40' Junction (on the spin-orbit torque wiring side)
41, 41A, 41B Spin current generating part
42A, 42B, 42C Low resistance part
100, 200, 300 Magnetoresistance effect element
I Current
S$^+$ Upward spin
S$^-$ Downward spin
M$_{21}$, M$_{23}$ Magnetization
I$_1$ First current path
I$_2$ Second current path
110 First power supply
120 Second power supply

The invention claimed is:

1. A spin current magnetization rotational element comprising:
   a first ferromagnetic metal layer configured for a direction of magnetization to be changed; and
   a spin-orbit torque wiring extending in a direction intersecting a lamination direction of the first ferromagnetic metal layer and bonded to the first ferromagnetic metal layer, the spin-orbit torque wiring including:
      a spin current generating part made of a material generating a spin current;
      one or two low resistance parts made of a material having lower electrical resistance than electrical resistance of the spin current generating part, the low resistance parts being configured to be disposed to have the spin current generating part interposed therebetween in a direction in which a current flows; and a narrow portion, at least a part of the narrow portion constituting a junction to the first ferromagnetic metal layer, the narrow portion being at least a part of the spin current generating part, the narrow portion having a thickness smaller than a thickness of a portion of the spin-orbit torque wiring other than the narrow portion, and the thicknesses being in the lamination direction of the first ferromagnetic metal layer.

2. The spin current magnetization rotational element according to claim 1, wherein the spin current generating part is at least a part of the narrow portion.

3. The spin current magnetization rotational element according to claim 2, wherein, in the spin-orbit torque wiring, the narrow portion has a width at least smaller than a width of a portion other than the narrow portion in a plan view from the lamination direction.

4. The spin current magnetization rotational element according to claim 1, wherein, in the spin-orbit torque wiring, the narrow portion has a width at least smaller than a width of a portion other than the narrow portion in a plan view from the lamination direction.

5. The spin current magnetization rotational element according to claim 1, wherein the spin-orbit torque wiring is disposed to cover the first ferromagnetic metal layer in a plan view from the lamination direction.

6. The spin current magnetization rotational element according to claim 1, wherein the spin current generating part is made of a material selected from a group of tungsten, rhenium, osmium, iridium and an alloy including at least one of the group.

7. The spin current magnetization rotational element according to claim 1, further comprising an insulating layer that is bonded to a face on a side opposite to a face of the spin-orbit torque wiring bonded to the fist ferromagnetic metal layer.

8. A magnetoresistance effect element comprising:
the spin current magnetization rotational element according to claim 1;
a second ferromagnetic metal layer in which a magnetization direction is fixed; and
a nonmagnetic layer interposed between the first ferromagnetic metal layer and the second ferromagnetic metal layer.

9. A magnetic memory comprising a plurality of the magnetic resistance effect elements according to claim 8.

10. A spin current magnetization rotational element comprising:
a first ferromagnetic metal layer configured for a direction of magnetization to be changed; and
a spin-orbit torque wiring extending in a direction intersecting a lamination direction of the first ferromagnetic metal layer and bonded to the first ferromagnetic metal layer, the spin-orbit torque wiring including:
a spin current generating part made of a material generating a spin current;
one or two low resistance parts made of a material having lower electrical resistance than electrical resistance of the spin current generating part, the low resistance parts being configured to be disposed to have the spin current generating part interposed therebetween in a direction in which a current flows; and a narrow portion, at least a part of the narrow portion constituting a junction to the first ferromagnetic metal layer, the narrow portion being at least a part of the spin current generating part,
wherein the spin current generating part has recessed parts disposed on each side of the spin current generating part in the direction in which the current flows, and the two low resistance parts, and
the each low resistance part is fit into each recessed part of the spin current generating part.

11. A spin current magnetization rotational element comprising:
a first ferromagnetic metal layer configured for a direction of magnetization to be changed; and
a spin-orbit torque wiring extending in a direction intersecting a lamination direction of the first ferromagnetic metal layer and bonded to the first ferromagnetic metal layer, the spin-orbit torque wiring including:
a spin current generating part made of a material generating a spin current;
one or two low resistance parts made of a material having lower electrical resistance than electrical resistance of the spin current generating part, the low resistance parts being configured to be disposed to have the spin current generating part interposed therebetween in a direction in which a current flows; and
a narrow portion, at least a part of the narrow portion constituting a junction to the first ferromagnetic metal layer, the narrow portion being at least a part of the spin current generating part,
wherein a length of the spin current generating part is smaller than a length of the first ferromagnetic metal layer in the direction in which the current flows.

12. The spin current magnetization rotational element according to claim 11, wherein the low resistance parts are contacted to the first ferromagnetic metal layer.

13. A spin current magnetization rotational element comprising:
a first ferromagnetic metal layer configured for a direction of magnetization to be changed; and
a spin-orbit torque wiring extending in a direction intersecting a lamination direction of the first ferromagnetic metal layer and bonded to the first ferromagnetic metal layer, the spin-orbit torque wiring including:
a spin current generating part made of a material generating a spin current;
one or two low resistance parts made of a material having lower electrical resistance than electrical resistance of the spin current generating part, the low resistance parts being configured to be disposed to have the spin current generating part interposed therebetween in a direction in which a current flows; and
a narrow portion, at least a part of the narrow portion constituting a junction to the first ferromagnetic metal layer, the narrow portion being at least a part of the spin current generating part,
wherein the spin-orbit torque wiring includes two low resistance parts having a recessed part disposed on one side of the low resistance part, and
each side of the spin current generating part is fit into the each recessed part of the low resistance parts.

* * * * *